(12) United States Patent
Lin

(10) Patent No.: US 10,761,578 B2
(45) Date of Patent: Sep. 1, 2020

(54) HEAT DISSIPATION DEVICE, HEAT DISSIPATION ASSEMBLY, AIR PIPE ASSEMBLY, AND TABLE HAVING HEAT DISSIPATION DEVICE

(71) Applicant: COOLER MASTER CO., LTD., New Taipei (TW)

(72) Inventor: Wen-Hsien Lin, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 164 days.

(21) Appl. No.: 15/938,071

(22) Filed: Mar. 28, 2018

(65) Prior Publication Data

US 2019/0212793 A1 Jul. 11, 2019

(30) Foreign Application Priority Data

Jan. 10, 2018 (TW) .............................. 107100984 A

(51) Int. Cl.
*G06F 1/20* (2006.01)
*F24F 1/022* (2019.01)
*H05K 7/20* (2006.01)

(52) U.S. Cl.
CPC .............. *G06F 1/203* (2013.01); *F24F 1/022* (2013.01); *H05K 7/20327* (2013.01); *H05K 7/20354* (2013.01); *F24F 2221/10* (2013.01)

(58) Field of Classification Search
CPC ....... G06F 1/203; F24F 1/022; F24F 2221/10; H05K 7/20327; H05K 7/20354
See application file for complete search history.

(56) References Cited

U.S. PATENT DOCUMENTS

| | | | | |
|---|---|---|---|---|
| 4,475,359 A | * | 10/1984 | Sano ..................... | F24F 13/222 62/150 |
| 2010/0134977 A1 | * | 6/2010 | Chang ................... | G06F 1/1632 361/695 |
| 2011/0073278 A1 | * | 3/2011 | Ting ........................ | G06F 1/203 165/80.2 |
| 2016/0047559 A1 | * | 2/2016 | Swanson ................ | F24F 1/022 62/115 |
| 2017/0273214 A1 | * | 9/2017 | Casparian ............... | G06F 1/203 |

* cited by examiner

*Primary Examiner* — Ana M Vazquez
(74) *Attorney, Agent, or Firm* — Maschoff Brennan

(57) ABSTRACT

A heat dissipation device for electronic device, a heat dissipation assembly, an air pipe assembly and a table. The heat dissipation device includes a refrigerator, an air pipe assembly and a heat dissipation assembly. The refrigerator has a cool air opening. The air pipe assembly has a first and second end portions, the first end portion detachably connects to the cool air opening. The heat dissipation assembly has a base body detachably connected to the refrigerator and a supporting plate pivoted to the base body. When the supporting plate is in a first position, the supporting plate has a first angle with a bottom plate of the base body. When the supporting plate is in a second position, the supporting plate has a second angle with the bottom plate. The second end portion is detachably connected to the supporting plate and is movably disposed in the air permeable.

17 Claims, 19 Drawing Sheets

HEAT DISSIPATION DEVICE, HEAT DISSIPATION ASSEMBLY, AIR PIPE ASSEMBLY, AND TABLE HAVING HEAT DISSIPATION DEVICE

CROSS-REFERENCE TO RELATED APPLICATIONS

This non-provisional application claims priority under 35 U.S.C. § 119(a) on Patent Application No(s). 107100984 filed in Taiwan, R.O.C. on Jan. 10, 2017, the entire contents of which are hereby incorporated by reference.

TECHNICAL FIELD

The disclosure relates to a heat dissipation device for electronic devices, a heat dissipation assembly, an air pipe assembly and a table having a heat dissipation device, more particularly to a heat dissipation device for electronic devices, a heat dissipation assembly, an air pipe assembly and a table having a heat dissipation device that are able to improve cooling efficiency of notebook computer.

BACKGROUND

Notebook computers have become a very important product in the market as people change their usage habits. An obvious advantage of a notebook computer is its portability, thus the notebook computer can be used in many places, not only at home and at the office, but also during commuting and flights, etc., such that people can do work, read online articles or clips, or play online games regardless of location. Some users are very demanding on gaming fluency when run game at a high resolution, so they would use high end processors. The high end processors will generate more waste heat. However, due to the limitations of the notebook computer, the heat dissipater in the notebook computer has a limited ability to remove the waste heat.

In prior art, some of the notebook computers have one or more fans inside, so they can suck air from the bottom side, and then exhaust the air from lateral sides or rear side so as to remove the waste heat. However, the bottom side of the notebook computers is usually in contact with the table or desk, resulting in the notebook computer not able to suck air from the bottom side. Even if the air can be sucked into the notebook computer, the cooling effect is limited because the air is not cool enough.

SUMMARY

The present disclosure provides a heat dissipation device for electronic device, a heat dissipation assembly, an air pipe assembly and a table having a heat dissipation device, which are beneficial for a notebook computer to suck air from the bottom side and helping the notebook computer to suck air, which is at a temperature lower than room temperature, thereby solving the heat dissipation problem in prior art.

One embodiment of the disclosure provides a heat dissipation device for electronic device, and the heat dissipation device includes a refrigerator, an air pipe assembly and a heat dissipation assembly. The refrigerator has a cool air opening. The air pipe assembly has a first end portion and a second end portion, and the first end portion is detachably connected to the cool air opening. The heat dissipation assembly has a base body and a supporting plate, the base body is detachably connected to the refrigerator, the supporting plate is pivoted to the base body so as to be movable between a first position and a second position. When the supporting plate is in the first position, the supporting plate has a first angle with a bottom plate of the base body. When the supporting plate is in the second position, the supporting plate has a second angle with the bottom plate. The second end portion is detachably connected to the supporting plate, the supporting plate has an air permeable area, and the second end portion is movably disposed in the air permeable area.

One embodiment of the disclosure provides a heat dissipation assembly includes a base body and a supporting plate. The base body includes a first sidewall, a second sidewall and a bottom plate. The first sidewall is opposite to the second sidewall, the first sidewall has a first connecting part, and the second sidewall has a second connecting part. The supporting plate has a third connecting part and a fourth connecting part, the third connecting part detachably is pivoted to the first connecting part, the fourth connecting part is detachably pivoted to the second connecting part, the supporting plate has a first position and a second position. When the supporting plate is in the first position, the supporting plate has a first angle with the bottom plate; when the supporting plate is in the second position, the supporting plate has a second angle with the bottom plate. The supporting plate has an air permeable area which is connected to two opposite sides of the supporting plate.

One embodiment of the disclosure provides an air pipe assembly including a hollow tube, a first end portion and a second end portion. The first end portion is connected to an end of the hollow tube. The second end portion is connected to another end of the hollow tube, the second end portion has a cover, the cover has a cavity, the cavity is connected to a chamber of the hollow tube, the cover has a contact surface, and a peripheral of the contact surface is disposed with a plurality positioning parts.

One embodiment of the disclosure provides a table having a heat dissipation device. The table includes a table board, a supporting plate, a refrigerator and air pipe assembly. The table board has a recess, and the table board is connected with a shelf. The supporting plate is disposed in the recess, and the supporting plate has an air permeable area. The refrigerator is disposed in the shelf, and the refrigerator has a cool air opening. The air pipe assembly has a first end portion and a second end portion, the first end portion is detachably connected to the cool air opening, and the second end portion is movably disposed in the air permeable area.

According to the heat dissipation device, the heat dissipation assembly, the air pipe assembly and the table as discussed above, the electronic device can be placed on a portion of the supporting plate which is permeable to air, so the electronic device is able to suck cool air from bottom side. In addition, the air pipe assembly helps to targetedly provide cool air generated by the refrigerator to the electronic device, thereby reducing the chance of the cool air to from escaping to the environment. That is, the position of the air pipe assembly can be changed according to the location of the air inlet of the electronic device, which allows the electronic device to directly suck the cool air, thereby improving the cooling efficiency of the electronic device as well as solving the heat dissipation problem in the prior art.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
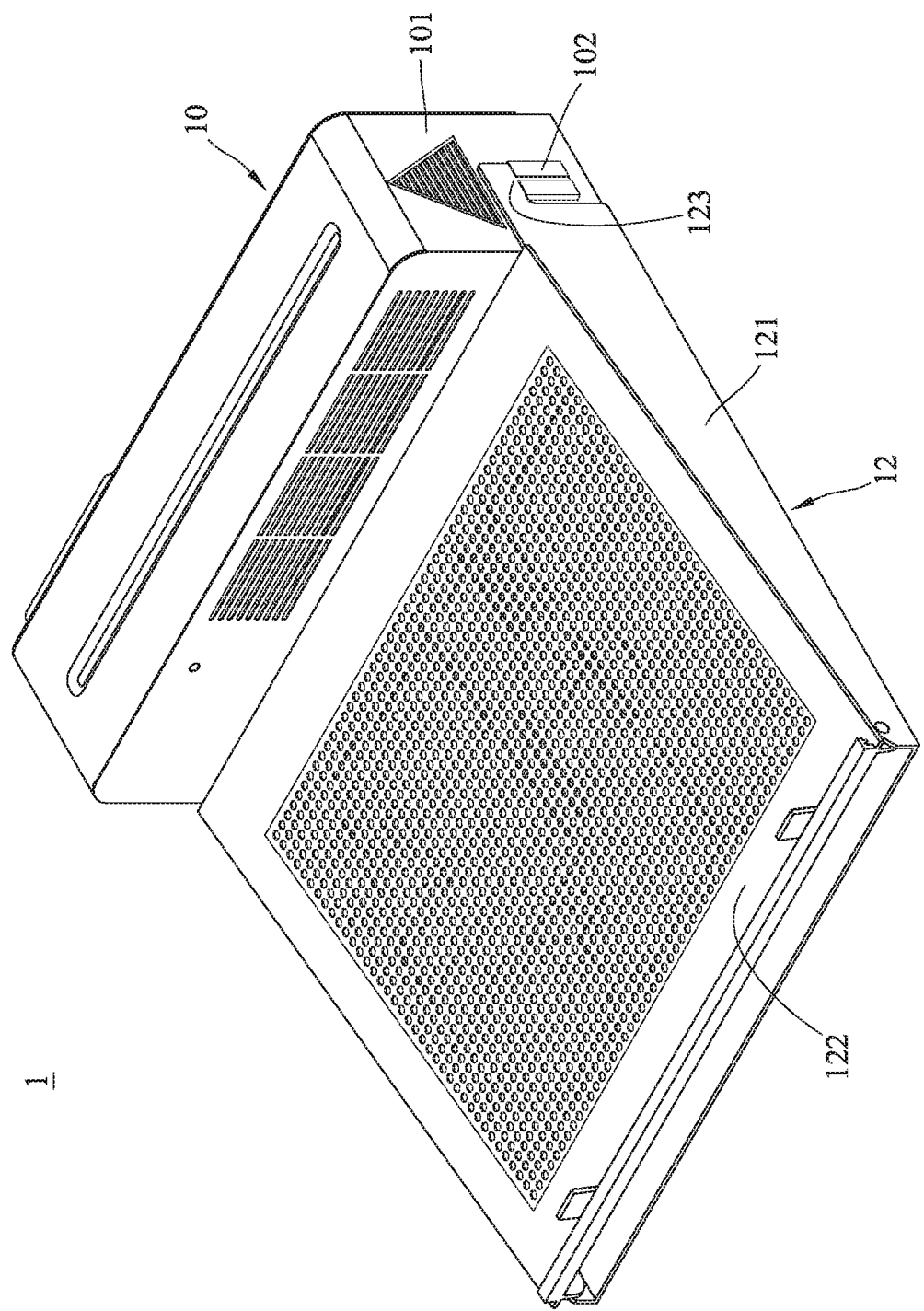
FIG. 1 is a perspective view of a heat dissipation device for electronic device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known main structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure. Furthermore, in order to simplify the drawings, some conventional structures and components are drawn in a simplified manner to keep the drawings clean.

Please refer to FIG. 1, FIG. 1 is a perspective view of a heat dissipation device for electronic device according to one embodiment of the disclosure. This embodiment provides a heat dissipation device 1 for electronic device. The heat dissipation device 1 can be roughly divided into two parts, one is a refrigerator 10, and the other is a heat dissipation assembly 12. The refrigerator 10 and the heat dissipation assembly 12 are detachably assembled to each other. In one embodiment, when it is attempted to bring the heat dissipation device 1 to another place, the refrigerator 10 and the heat dissipation assembly 12 can be disassembled and stored in storage bags separately, thereby reducing the inconvenience of carrying them. In the case of FIG. 1, the refrigerator 10 includes a casing 101, and the heat dissipation assembly 12 includes a base body 121 and a supporting plate 122. In one scenario, an electronic device, such as a notebook computer or other devices, that will generate heat while in operation, can be placed on the supporting plate 122 of the heat dissipation assembly 12. In order to let those skilled in the art to understand the present disclosure, the following takes a notebook computer as an example of the electronic device, but the present disclosure is not limited to thereto.

FIG. 1 shows that the refrigerator 10 and the heat dissipation assembly 12 are assembled to each other; however, the present disclosure is not limited to how the refrigerator 10 is assembled to the heat dissipation assembly 12. In one embodiment, there are protrusion parts 123 on the base body 121 and slots 102 on the casing 101 for the insertion of the protrusion parts 123. The refrigerator 10 is able to be assembled to the heat dissipation assembly 12 when the protrusion parts 123 are inserted into the slots 102. It is understood that the protrusion parts 123 and the slots 102 are fasteners for the base body 121 to be detachably connected to the refrigerator 10. In detail, the protrusion part 123 is connected to the base body 121 and bent downward, the slot 102 has an opening facing upward, and the protrusion part 123 has a width substantially the same as the width of the opening of the slot 102, such that the protrusion part 123 can be inserted into the slot 102. In addition, the protrusion part 123 is not recommended too short, otherwise it will easily be detached from the slot 102, resulting in unstable assembly of the refrigerator 10 and the heat dissipation assembly 12. Furthermore, it is understood that the closer the shape of the protrusion part 123 and the shape of the slot 102 helps to reduce the unstable issue.

In one embodiment, the quantity of the slots 102 on the casing 101 and the quantity of the protrusion part 123 on the base body 121 are not restricted; for example, in some other embodiments, the casing 101 may have only one slot 102, and the base body 121 may have only one protrusion part 123. Furthermore, any proper size and shape of the protrusion part 123 and the slot 102, that help to stably assembly the refrigerator 10 and the heat dissipation assembly 12, fall within the scope of the present disclosure.

In addition, the present disclosure is not limited to the material of the casing 101 of the refrigerator 10 and the material of the base body 121 and the supporting plate 122 of the heat dissipation assembly 12, it can be adjusted according to actual requirements, such as production cost, or other business considerations. For example, both the base body 121 and the supporting plate 122 are made of metal. For another example, both the casing 101 and the base body 121 are made of metal, and the supporting plate 122 is made of plastic. The protrusion part 123 and the base body 121 may be integrated into a single piece or be assembled together via welding. In a similar manner, the slot 102 may be integrated with the casing 101 or be attached on the casing 101 via welding. In one embodiment, the slot 102 and the protrusion part 123 should have a certain degree of structural strength, otherwise it might cause the unstable assembly of the refrigerator 10 and the heat dissipation assembly 12.

It is noted that the refrigerator 10 and the heat dissipation assembly 12 can be assembled together through other manners. In this or some other embodiments, the refrigerator 10 and the heat dissipation assembly 12 can be fixed to each other by matching appearance shapes thereof (for example, the casing 101 may have a mortise, and the base body 121 may have a tenon, such that the casing 101 and the base body 121 can be assembled via a mortise and tenon joint); in such a case, the refrigerator 10 may have no slot 102, and the heat dissipation assembly 12 may have no protrusion part 123. Alternatively, the refrigerator 10 and the heat dissipation assembly 12 can be fixed to each other through a pair of fasteners, one of the fasteners is disposed at the casing 101, and the other is disposed at the base body 121; with the connection of the fasteners, the refrigerator 10 can be fixed to the heat dissipation assembly 12; when the fasteners are detached, the refrigerator 10 is allowed to be detached from the heat dissipation assembly 12.

Figure 2:
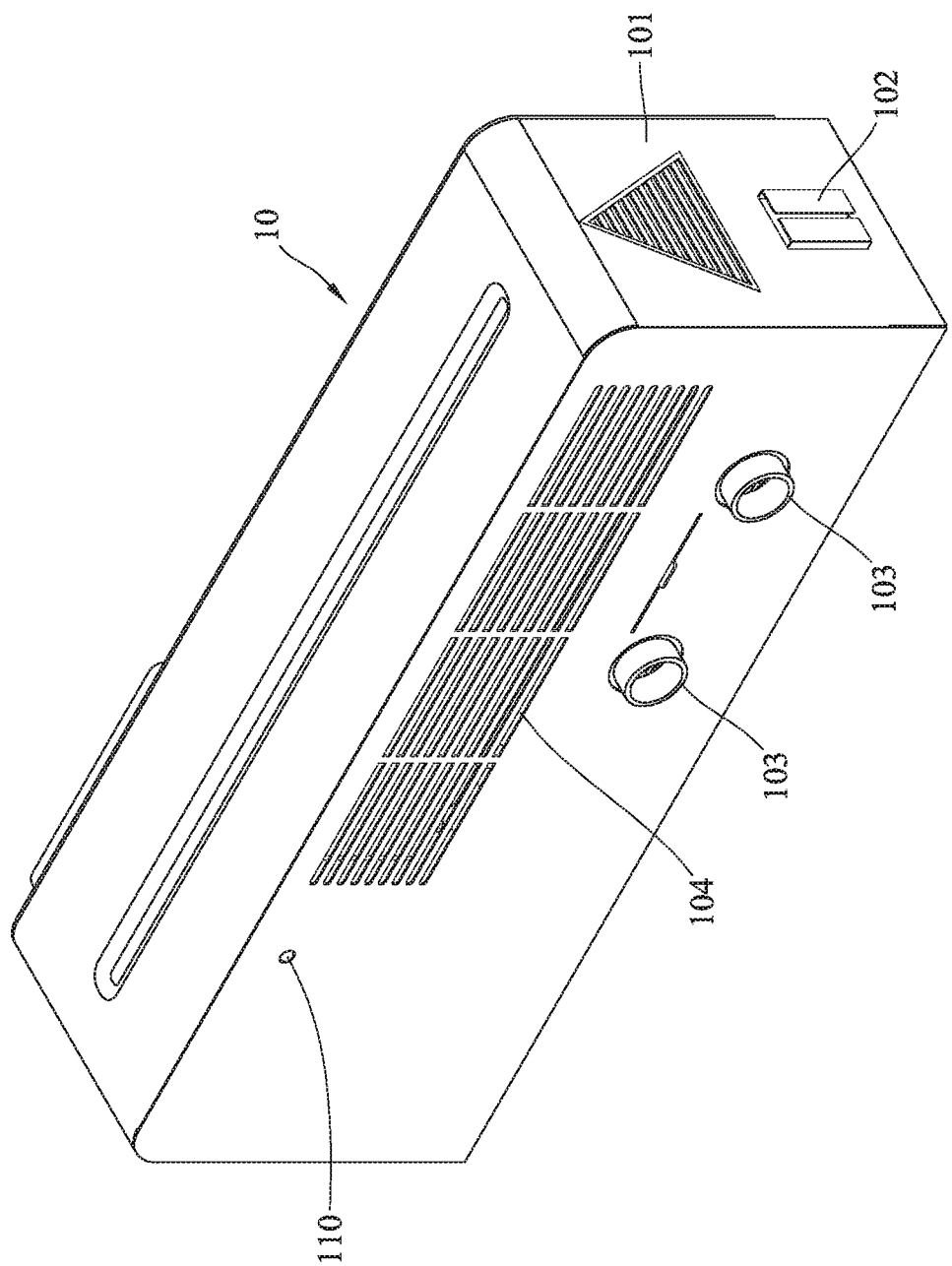
FIG. 2 is a perspective view of a refrigerator according to one embodiment of the disclosure.
Figure 3:
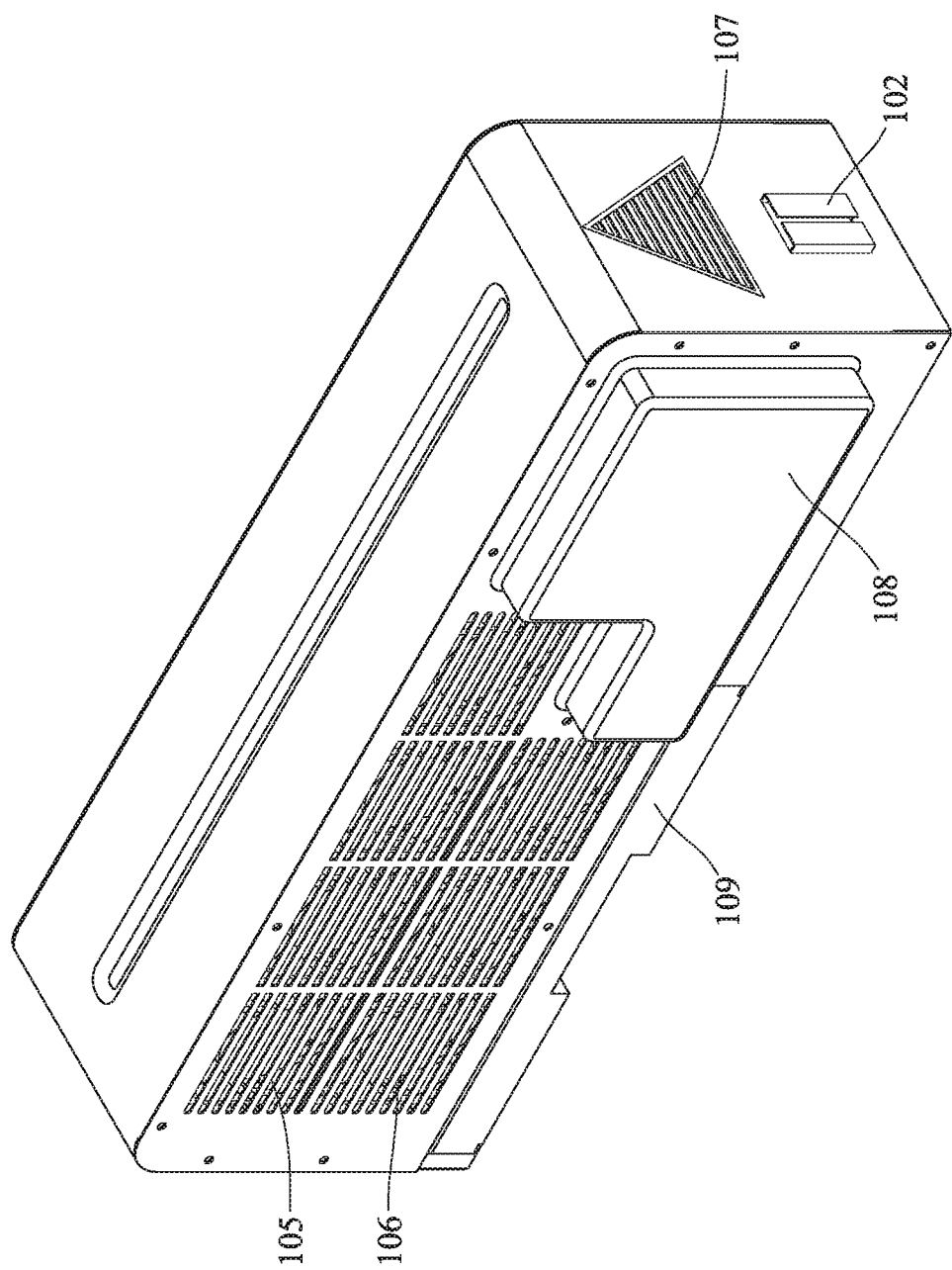
FIG. 3 is another perspective view of the refrigerator according to one embodiment of the disclosure.

Then, the refrigerator 10 will be described. Please further refer to FIG. 2 and FIG. 3, FIG. 2 is a perspective view of a refrigerator according to one embodiment of the disclosure, and FIG. 3 is another perspective view of the refrigerator according to one embodiment of the disclosure. FIGS. 2 and 3 are the refrigerator 10 taken from different view angles. As shown in figure, except the slot 102, the casing 101 of the refrigerator 10 further has cool air openings 103 and vents 104, 105, 106 and 107, and there are a power supply 108 and a water tank 109 detachably disposed on the casing 101.

In this or some other embodiments, the refrigerator 10 is, for example, a small size air-conditioner, the refrigerator 10 can cool the air, which is sucked into the casing 101, and blow it out from the cool air openings 103, such that the temperature of the air (cold air) blown out from the cool air openings 103 would be cooler than ambient air; that is the air blown out from the cool air openings 103 would be at a temperature lower than room temperature. In the example that the refrigerator 10 has the cool air openings 103, there may be at least one valve 1031 for closing or opening one or all of the cool air openings 103. In one embodiment, there is one valve 1031 disposed on a rail, such that the valve 1031 may be slide to and cover one of the cool air openings 103.

To achieve the function, the refrigerator 10 needs the power supply 108 to provide electrical power. In one embodiment, the power supply 108 is connected with a plug which can be inserted into a socket to receive electricity. In such a case, the power supply 108 contains a transformer, rectifier or the like, but the present disclosure is not limited thereto. Alternatively, the power supply 108 can be connected to a USB port on the electronic device (e.g. a notebook computer) to get electrical power. In another case, the power supply 108 can be connected to a transformer of the notebook computer to get electrical power. Furthermore, the power supply 108 may contain a battery to store electricity for other electronic devices, mobile devices, or the refrigerator 10.

Moreover, the present disclosure does not restrict where air enters into the casing 101. In one embodiment, the refrigerator 10 may contain one or more air generators disposed within the casing 101 and oriented in different directions, for example, toward the cool air openings 103 and the vent 105. By the air generators, air would enter into the casing 101 through the vent 104, the vent 106 and the vent 107. In other words, by the air generators, air would be sucked into the casing 101 through the vent 104, the vent 106 and the vent 107. In this embodiment, the cool air openings 103 and the vent 106 are respectively located at two opposite sides of the casing 101, so they can form an air channel, enabling air to stream into the casing 101 through the vent 106 and then blown out from the casing 101 through the cool air opening 103. In addition, the vent 104 and the vent 105 are also respectively located at the opposite sides of the casing 101, such that they can form another air channel for air to stream into the casing 101 through the vent 104 and then blown out from the casing 101 through the vent 105. In this embodiment, the air channel between the vent 106 and the cool air opening 103 is for blowing cooled air, and the air channel between the vent 104 and the vent 105 is for blowing hotter air. It should be understood by those skilled in the art that the air generator is not limited to be an air blower or a suction blower, as long as it can create the aforementioned air flow.

In addition, the casing 101 further includes an indicator 110 that can indicate the state of the refrigerator 10, for example, the temperature, the battery, or the water level in the water tank 109, but the present disclosure is not limited thereto. In some other embodiments, the indicator 110 may be a display screen that can show more detail of the refrigerator 10. The indicator 110 can be disposed at any side of the casing 101 as long as it is easily seen by users. As shown in this embodiment, the indicator 110 and the cool air openings 103 are located at the same side of the casing 101.

Figure 4:
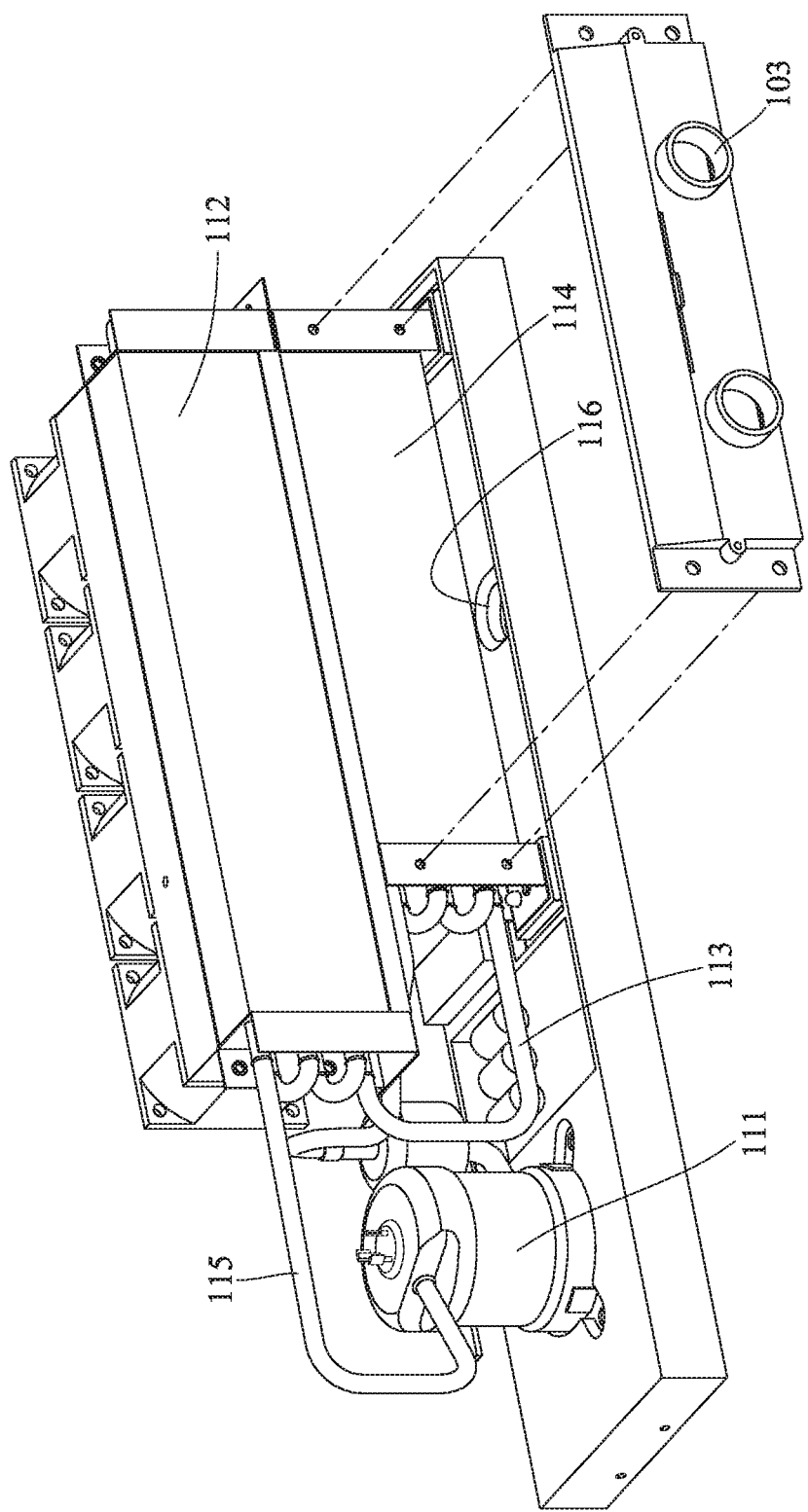
FIG. 4 is a perspective view of internal structure of the refrigerator according to one embodiment of the disclosure.

To better understand the refrigerator 10, please refer to FIG. 4. FIG. 4 is a perspective view of internal structure of the refrigerator according to one embodiment of the disclosure. As shown in FIG. 4, the casing 101 of the refrigerator 10 includes a compressor 111, a first heat exchanger 112, a pressure relief valve 113, a second heat exchanger 114 and a plurality of refrigerant pipes 115 disposed therewithin. The refrigerant pipes 115 are connected through the compressor 111, the first heat exchanger 112, the pressure relief valve 113 and the second heat exchanger 114, and is able to form a sealed channel for accommodating refrigerant (not shown).

According to the characteristics of the refrigerant, the temperature of the refrigerant will rise with the increase of pressure. In this embodiment, the compressor 111 is configured to compress the refrigerant so as to pump the refrigerant and change its phase. Thus, the compressor 111 can transform the refrigerant into a hot gaseous refrigerant. Then, the hot gaseous refrigerant is moved to the first heat exchanger 112 to go through a first heat exchange process. During the process, the temperature of the gaseous refrigerant is decreased, such that the gaseous refrigerant is changed into liquid refrigerant. Hence, the first heat exchanger 112 is also called a condenser for condensing gaseous refrigerant. It is understood that the condensation (the refrigerant being converted from gaseous phase into liquid phase) is an exothermic reaction, thus the peripheral of the first heat exchanger 112 is relatively high in temperature.

Then, the liquid refrigerant is transferred to the pressure relief valve 113 from the first heat exchanger 112, and then the pressure relief valve 113 would decrease the pressure of the liquid refrigerant to make it a low temperature and low pressure liquid refrigerant. In one embodiment, the pressure relief valve 113 may be a capillary. Then, the refrigerant is transferred to the second heat exchanger 114 from the pressure relief valve 113 to go through a second heat exchange process. During the second heat exchange process, the temperature of the liquid refrigerant is raised, such that the liquid refrigerant is changed into gaseous refrigerant. That is, the second heat exchanger 114 is able to transform a low temperature and low pressure liquid refrigerant into a high temperature and low pressure gaseous refrigerant. Hence, the second heat exchanger 114 is also called an evaporator for evaporating liquid refrigerant. It is understood that the evaporation (the refrigerant being converted from liquid phase into gaseous phase) is an endothermic reaction, thus the peripheral of the second heat exchanger 114 is relatively low in temperature.

As shown in FIG. 4, the cool air openings 103 are close to the second heat exchanger 114, such that the cool air around the second heat exchanger 114 can exit through the cool air openings 103. In practical, since the peripheral of the second heat exchanger 114 is relatively low in temperature, moisture contained in the air might get condensed and become droplets on the second heat exchanger 114, and the droplets falling on the casing 101 would result in puddle of water. To avoid such problem, the bottom of the casing 101 has a liquid outlet 116 for draining the condensed droplets. In this or some other embodiments, the liquid outlet 116 may be connected to the water tank 109 or to another outlet pipe (not shown).

Figure 5:
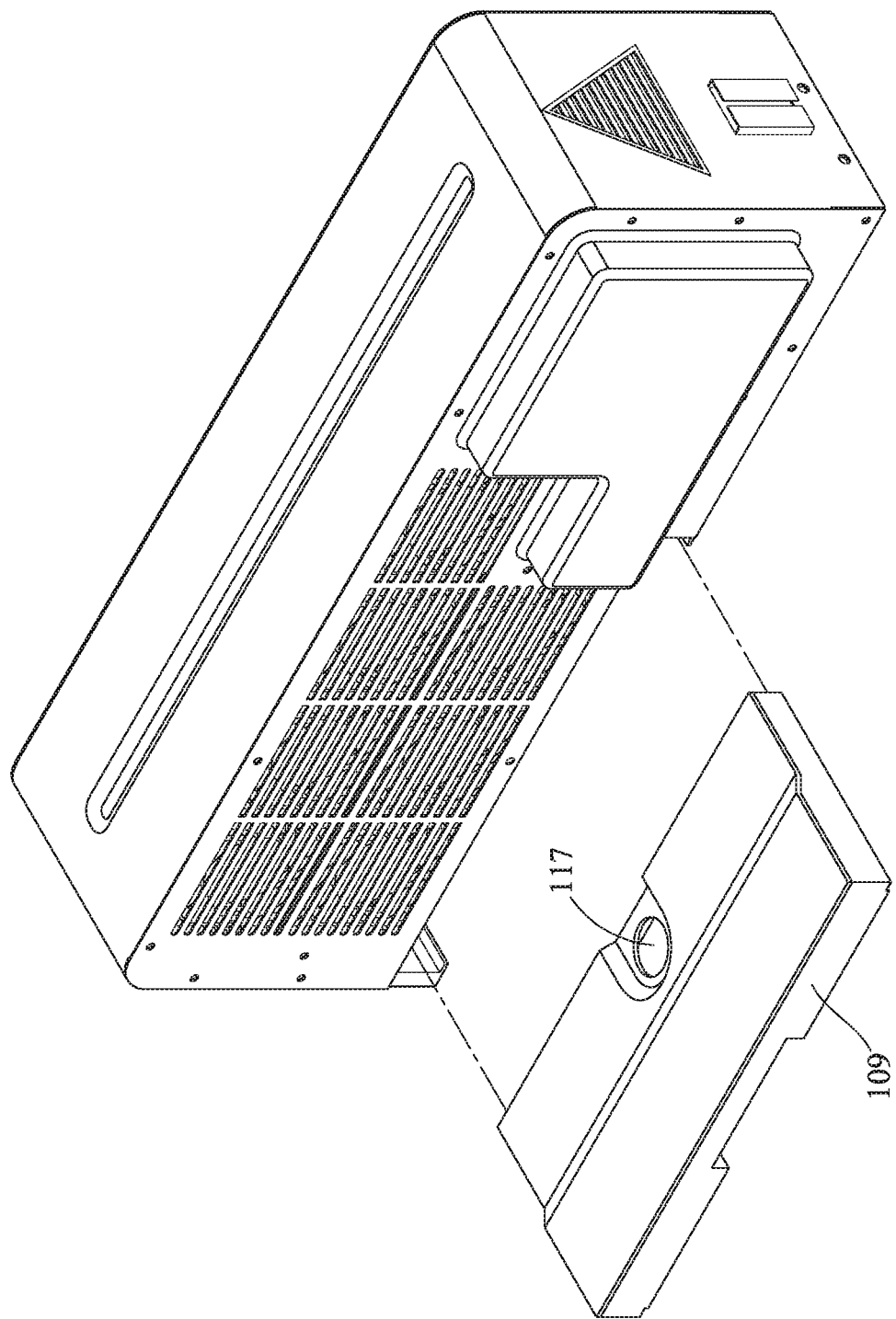
FIG. 5 is a perspective view of a water tank according to one embodiment of the disclosure.

In one embodiment, please refer to FIG. 5, FIG. 5 is a perspective view of a water tank according to one embodiment of the disclosure. As shown in FIG. 5, the water tank 109 is detachably disposed at the bottom of the casing 101, and the water tank 109 has an opening 117 on an upper surface thereof. When the water tank 109 is assembled with the casing 101, the opening 117 is right under the liquid outlet 116, such that the condensed droplets from the second heat exchanger 114 can be drained into the water tank 109 through the liquid outlet 116 and the opening 117. In one embodiment, the water tank 109 is made of a translucent or transparent material, so it is easy for users to see the water level inside the water tank 109. Another option is that only a part of the water tank 109 is made of translucent or transparent material; for example, only a side of the water tank 109 is transparent, but the present disclosure is not limited thereto.

In addition, there may be a water level sensor (not shown) disposed within the water tank 109, for sensing the water lever in the water tank 109. When the water level in the water tank 109 exceeds a threshold value, the water level sensor would generate a 'tank full' signal. In detail, the water level sensor may include two electric circuit ends that are disposed near the upper surface of the water tank 109, located close to each other but not yet electrically connected to each other. When the water level exceeds the electric circuit ends, the electric circuit ends can be electrically connected through the liquid so as to trigger the water level sensor to generate the 'tank full' signal. In other word, the threshold value may be taken as a predetermined water level or the height of the electric circuit ends in the water tank 109. The water level sensor is able to communicate with the electronic device through a wireless mean, such as Bluetooth. Alternatively, the 'tank full' signal may be sent to the refrigerator 10, and the indicator 110 would flash or produce sound when receiving it for reminding the user to change the water tank 109. It is noted that the indicator 110 is not restricted to a light emitting device or sound generator.

Figure 6:
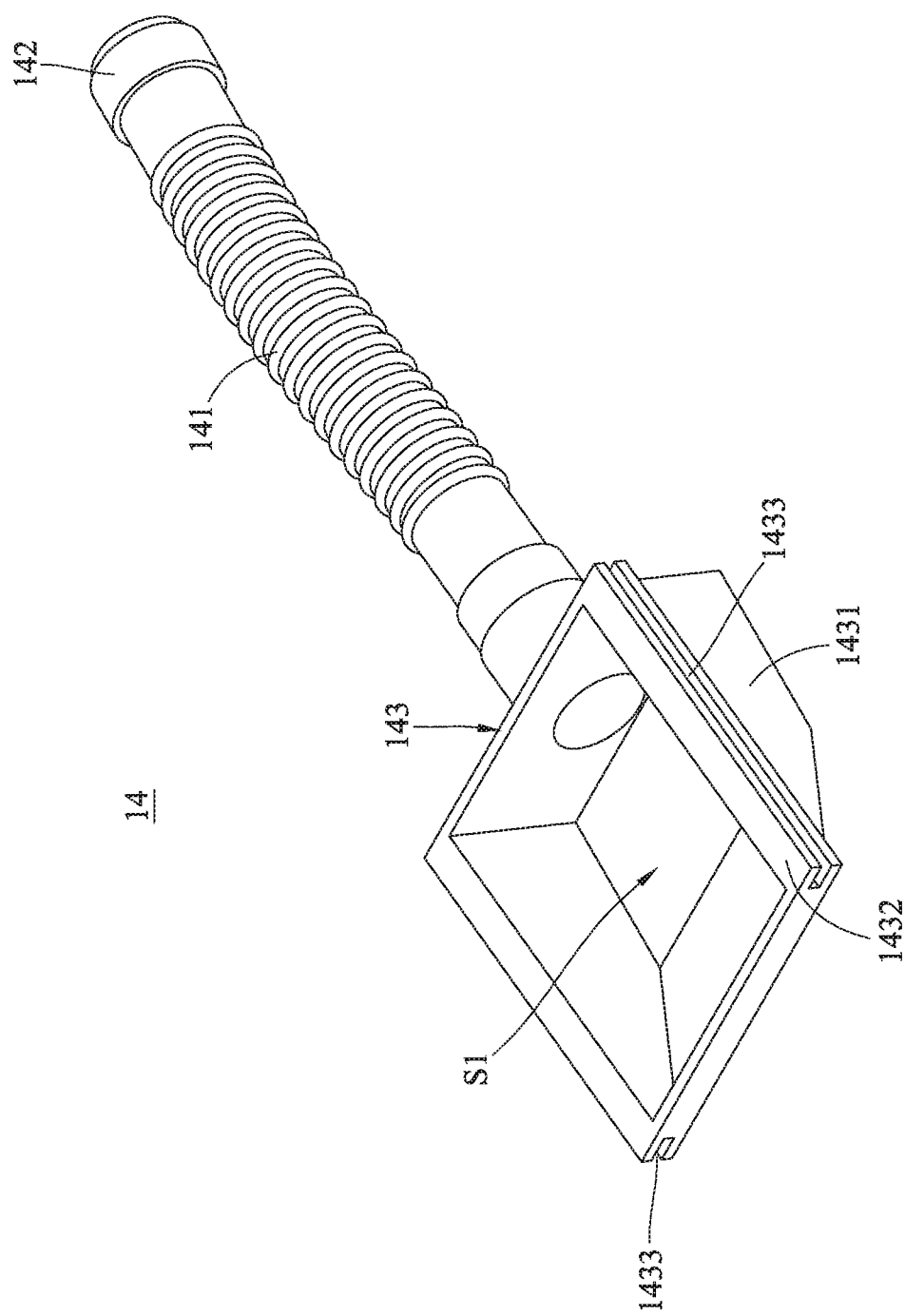
FIG. 6 is a perspective view of an air pipe assembly according to one embodiment of the disclosure.
Figure 7:
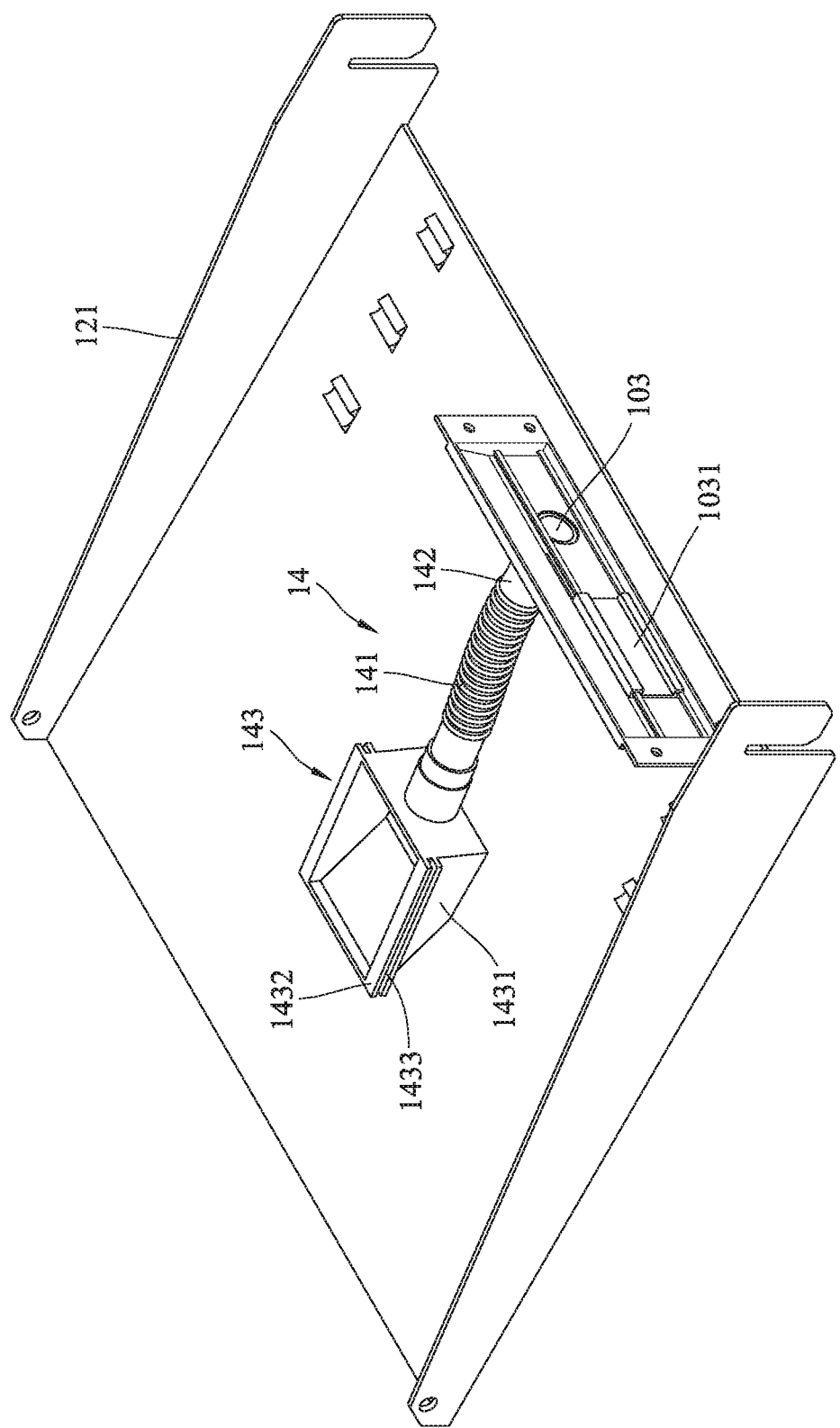
FIG. 7 is a perspective view of the air pipe assembly being disposed on the refrigerator according to one embodiment of the disclosure.

Then, please refer to FIGS. 6-7, FIG. 6 is a perspective view of an air pipe assembly according to one embodiment of the disclosure, and FIG. 7 is a perspective view of the air pipe assembly being disposed on the refrigerator according to one embodiment of the disclosure. As shown in the figures, the air pipe assembly 14 includes a hollow tube 141, a first end portion 142 and a second end portion 143. The first end portion 142 can be detachably connected to any one of the cool air openings 103. The second end portion 143 includes a cover 1431. The cover 1431 has a cavity S1 which is connected to a chamber of the hollow tube 141. The cover 1431 further has a contact surface 1432 and a plurality of positioning parts 1433 located at the periphery of the contact surface 1432. In one embodiment, the hollow tube 141 is flexible, deformable and retractable. For example, the hollow tube 141 may be a plastic flexible hose or corrugated tube. The first end portion 142 and the second end portion 143 are respectively located at two opposite ends of the hollow tube 141. The first end portion 142 may be a part of the hollow tube 141 that can be directly sleeved on the cool air opening 103. The cool air opening 103 may be formed by a protruding structure which is for the first end portion 142 to sleeve onto. In another case, the first end portion 142 may be a plug or fastener that can be plugged into or fixed to the cool air opening 103, and there is a respective structure in the cool air opening 103. The present disclosure is not limited to how the air pipe assembly 14 is fixed to the cool air opening 103. In addition, the present disclosure is not limited to the configurations of the cool air opening 103 and the first end portion 142, any design of the air pipe assembly 14, that can properly transfer air from the cool air opening 103, should fall within the scope of the present disclosure.

In consideration of air transportation efficiency in the air pipe assembly 14, the first end portion 142 is recommended be airtightly connected to the cool air opening 103. However, in practical, the cool air opening 103 and the first end portion 142 are acceptable be not airtight, as long as the air pipe assembly 14 is able to guild the air from the air from the cool air opening 103. In one embodiment, when the first end portion 142 is disposed on the cool air opening 103, they can be sleeved with a sleeving to cover the gap between the cool air opening 103 and the first end portion 142 so as to prevent air from escaping. In addition, an air tight ring or O-ring may be disposed between the cool air opening 103 and the first end portion 142 in order to prevent air from escaping.

It is noted that, in FIG. 7, the cool air openings 103 and the air pipe assembly 14 are an example showing how to assemble the air pipe assembly 14 to the cool air opening 103, but the quantity of the cool air openings 103 is not restricted. In addition, the cool air opening 103 can be closed or opened by the valve 1031 according to the current situation. For example, the quantity of the cool air openings 103 may be four, and each of them can be closed or opened. When it requires to use two air pipe assemblies 14 at the same time, two of the cool air openings 103 can be respectively connected to the two air pipe assemblies 14, and the rest cool air openings 103 would be closed by the valves 1031 so as to prevent cool air from escaping. However, the cool air openings 103 which are not connected to the air pipe assembly 14 can be opened if necessary, and the present disclosure is not limited thereto.

The second end portion 143 includes the cover 1431 that is directly connected to an end of the hollow tube 141. In one embodiment, the second end portion 143 may further include a structure (not shown) for connecting the cover 1431 to the hollow tube 141, such that the cover 1431 is indirectly and detachably connected to the hollow tube 141. It is noted that the present disclosure is not limited to how the cover 1431 is fixed to the second end portion 143, any design, that helps them to be fixed together, should fall within the scope of the present disclosure.

The cover 1431 is, for example, a shovel-shaped object, but is not restricted to a bowl shaped object, and the cavity S1 is defined by the recessed surface of the cover 1431. The contact surface 1432 is substantially flat, allowing the cover 1431 to closely move along the supporting plate 122 of the heat dissipation assembly 12, but the contact surface 1432 is not necessary be very flat. In one embodiment, the contact surface 1432 may be slightly unflat as long as it is still able to closely move along the supporting plate 122. In addition, the positioning parts 1433 at the periphery of the contact surface 1432 allows the cover 1431 to be mounted on the supporting plate 122 and helps to guide the movement of the contact surface 1432 with respect to the supporting plate 122. In one embodiment, the positioning parts 1433 are arranged symmetrically, and they are located at the same level with respect to the contact surface 1432.

The air pipe assembly 14 is for transporting air, from the cool air opening 103 to the cavity through the hollow tube 141. Thus, it is noted that any design, that helps air to smoothly flow from the cool air opening 103 to the supporting plate 122, would be consider as the air pipe assembly 14, and the configuration of the cover 1431 is not restricted. In addition, the present disclosure is not limited to the positioning parts 1433, its position and configuration, anything of it which helps to mount the cover 1431 onto the supporting plate 122 and guide the movement of the contact surface 1432 with respect to the supporting plate 122 all can be taken as the positioning part 1433. For example, the contact surface of the cover may be in a circle shape, an oval shape or a rectangle shape. In another embodiment, the positioning part may be a magnetic component, such that the cover can be attached on the supporting plate which contains ferromagnetic materials through magnetic force.

Figure 8:
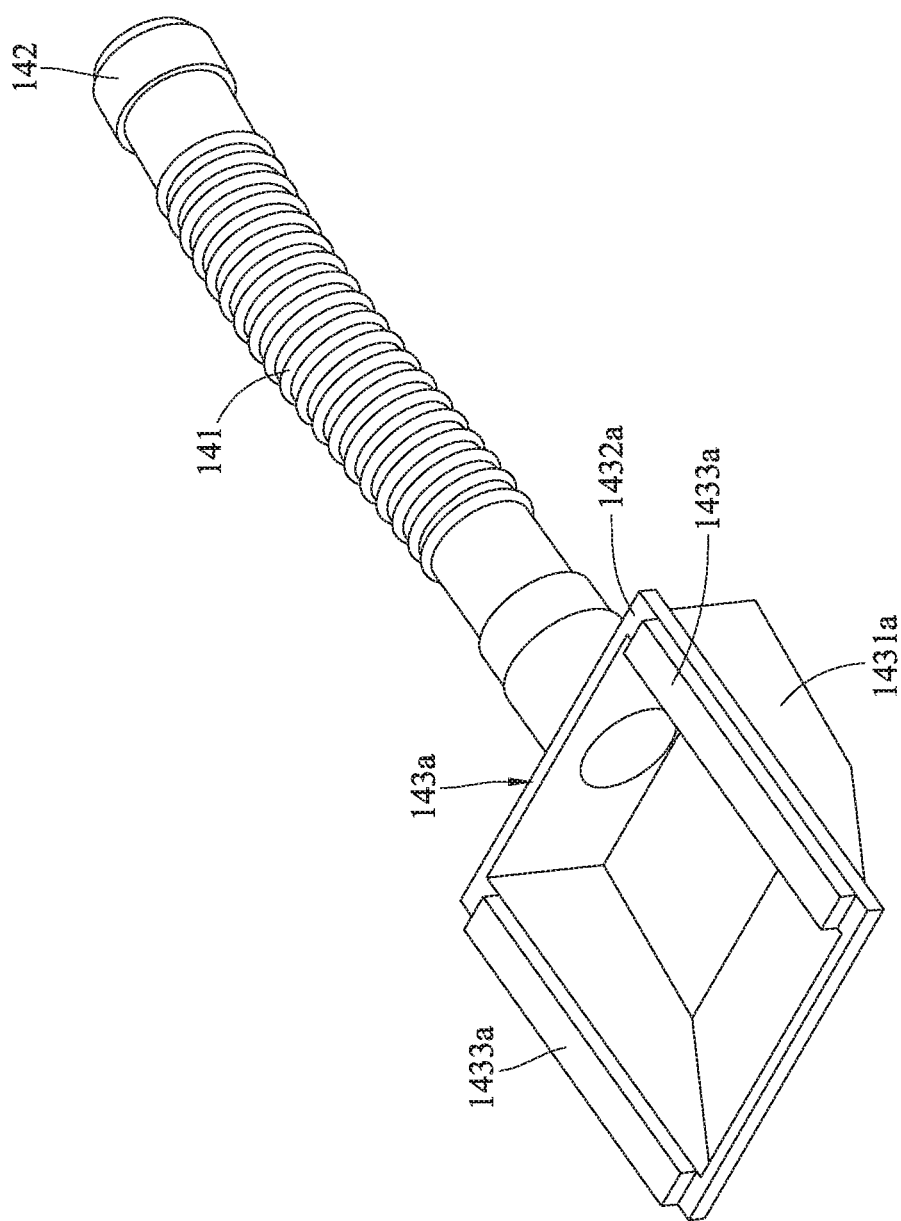
FIG. 8 is a perspective view of an air pipe assembly according to another embodiment of the disclosure.
Figure 9:
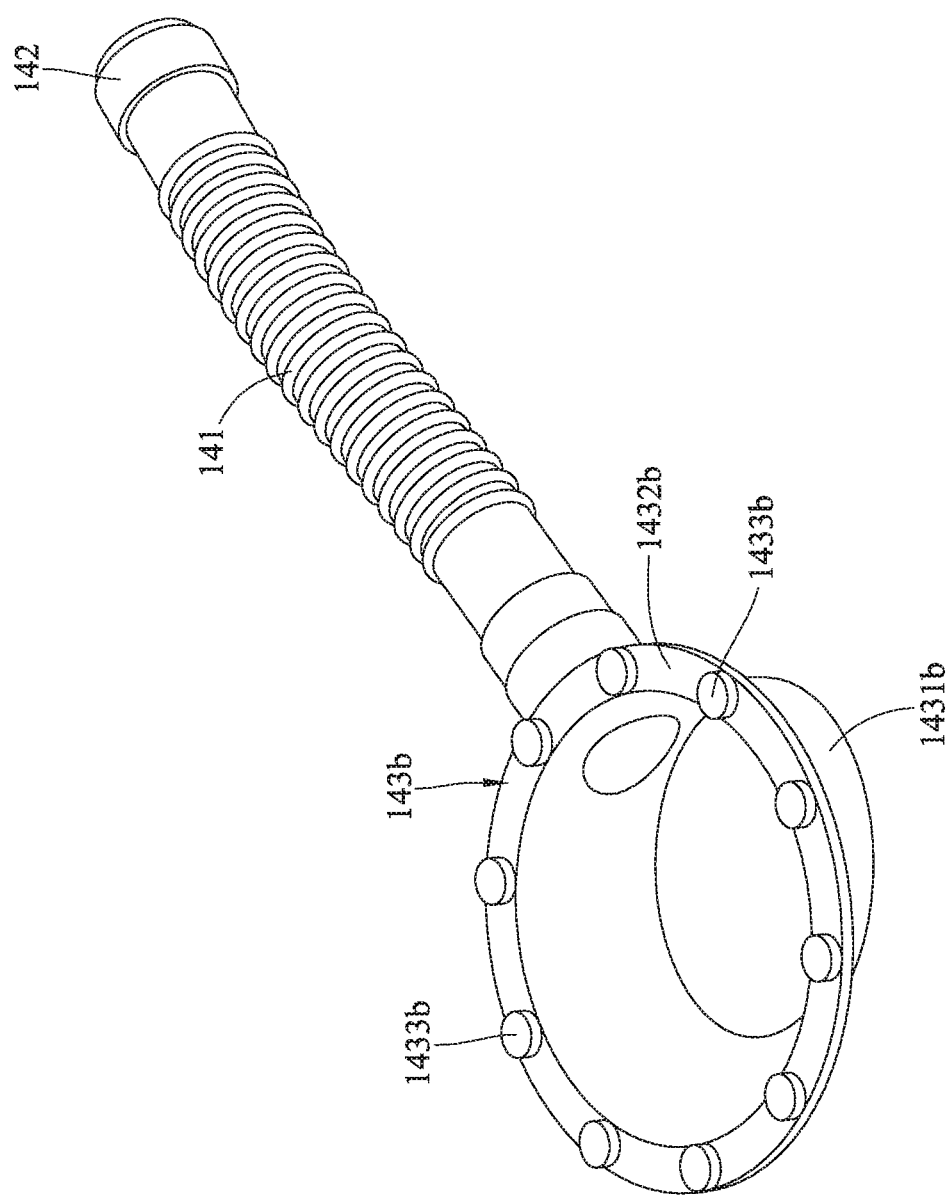
FIG. 9 is a perspective view of an air pipe assembly according to still another embodiment of the disclosure.

Please refer to FIG. 8 and FIG. 9, FIG. 8 is a perspective view of an air pipe assembly according to another embodiment of the disclosure, and FIG. 9 is a perspective view of an air pipe assembly according to still another embodiment of the disclosure. FIG. 8 shows an air pipe assembly 14*a*. The air pipe assembly 14*a* includes a second end portion 143*a* including a cover 1431*a*, and the cover 1431*a* has a contact surface 1432*a* and two positioning parts 1433*a*. The second end portion 143*a* in FIG. 8 and the second end portion 143 in FIG. 7 are different in material and shape, and each positioning part 1433*a* is disposed on the contact surface 1432*a* of the cover 1431*a* and is a magnetic component. The positioning parts 1433*a* do not entirely cover the contact surface 1432*a*. In one embodiment, the positioning parts 1433*a* are located opposite to each other and each of them may be a bar shaped component. Alternatively, the positioning parts 1433*a* may be embedded into the contact surface 1432*a* to have a surface coplanar with the contact surface 1432*a*. In another embodiment, the positioning parts 1433*a* may be disposed at the side surfaces of the cover 1431*a* so as to be adjacent to an edge of the contact surface 1432*a*.

FIG. 9 shows an air pipe assembly 14*b*, a cover 1431*b* of the air pipe assembly 14*b* in FIG. 9 and the cover 1431*a* of the second end portion 143*a* in FIG. 8 are different in shape, and positioning parts 1433*b* in FIG. 9 and the positioning parts 1433*a* in FIG. 8 are different in shape and location. In one embodiment, the cover 1431*b* is a bowl or cup shaped object, and a contact surface 1432*b* of the cover 1431*b* may be in a circle shape, an oval shape or a polygon shape, but the present disclosure is not limited thereto. The positioning part 1433*b* are disposed on the contact surface 1432*b* of the cover 1431*b* and each of them is a magnetic component. In more detail, the positioning parts 1433*b* are arranged along an edge of the contact surface 1432*b* and spaced apart from each other. In another embodiment, the positioning parts 1433*b* may be connected to each other to become a single ring.

Figure 10:
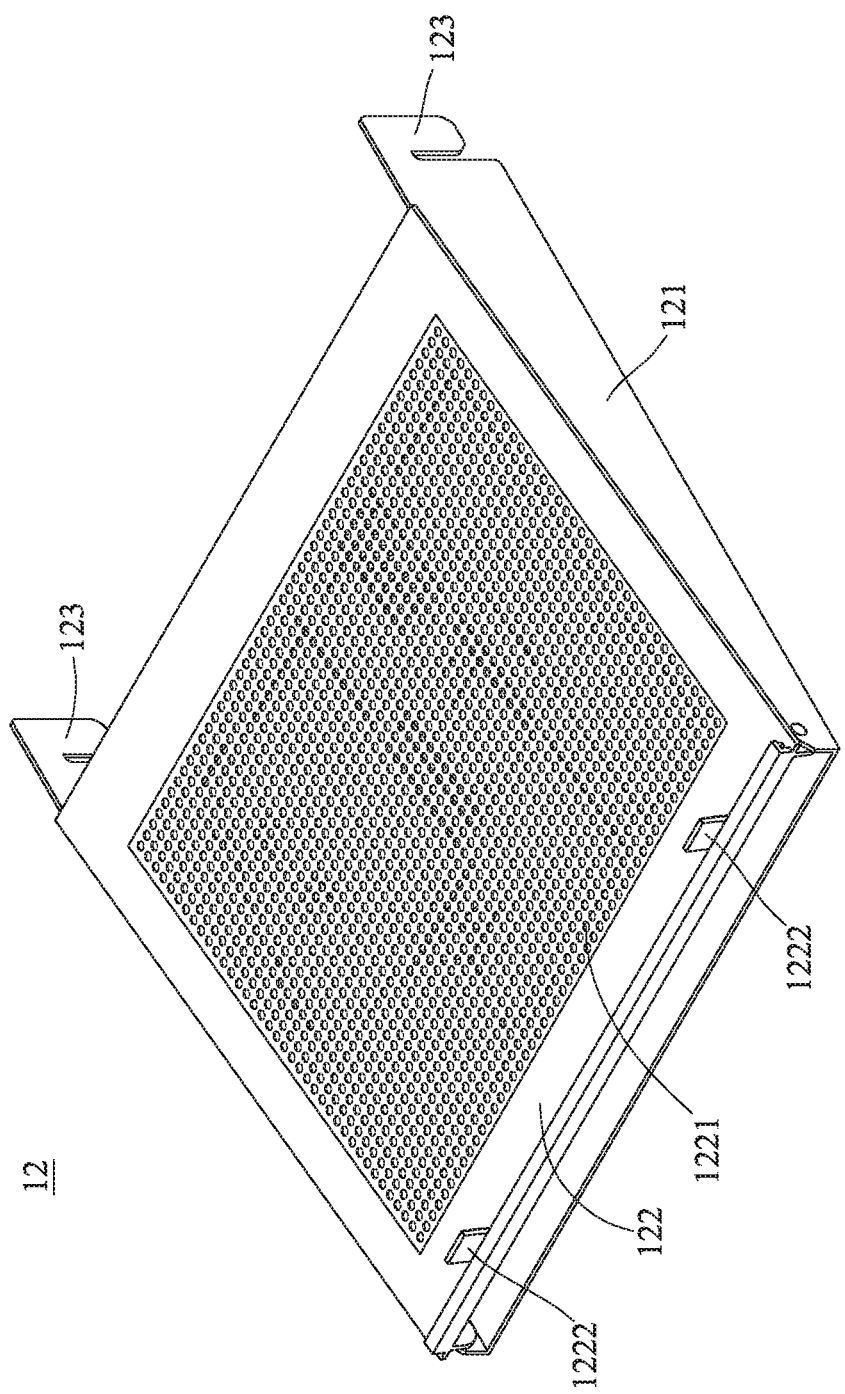
FIG. 10 is a perspective view of a heat dissipation assembly according to one embodiment of the disclosure.
Figure 11:
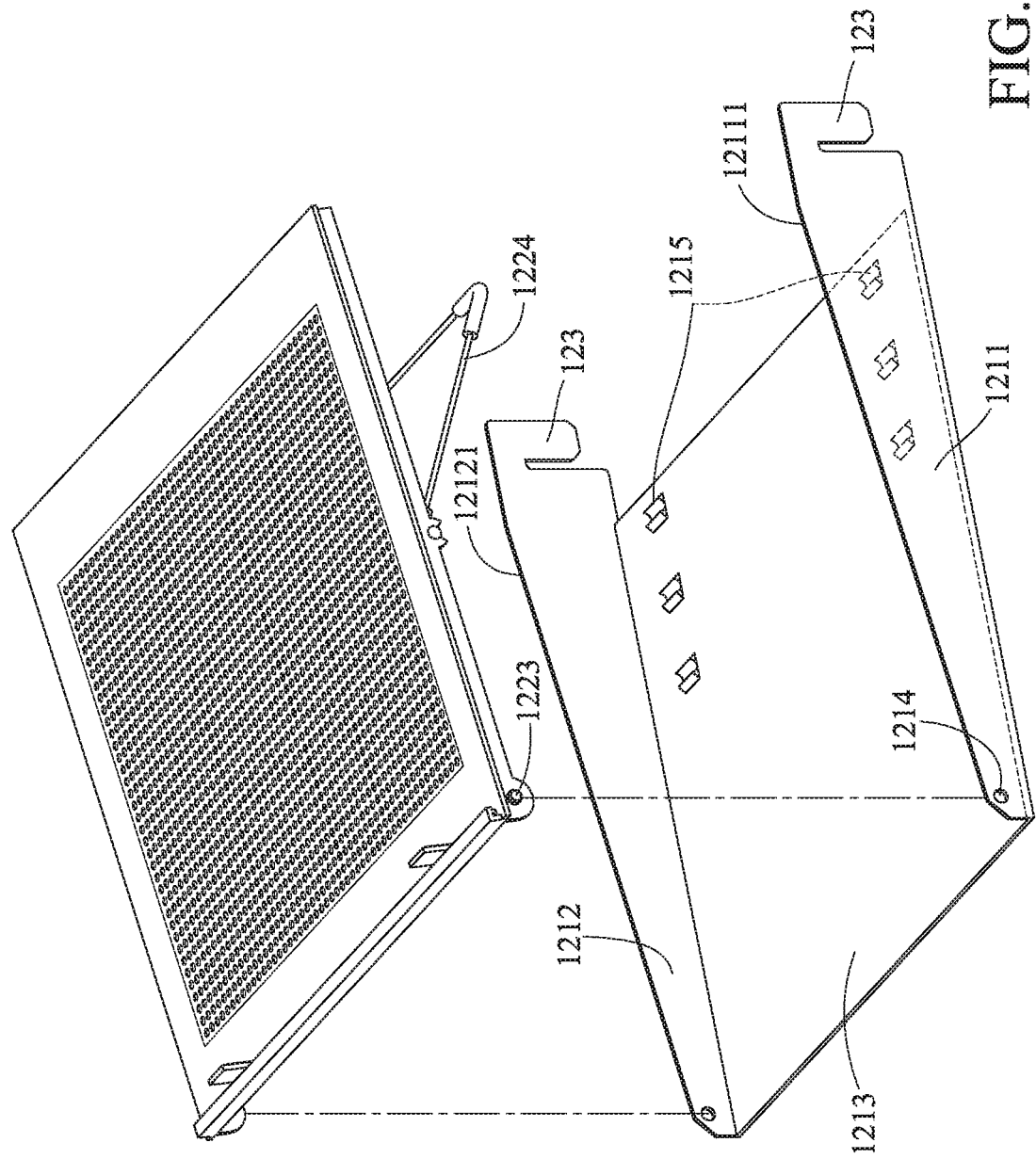
FIG. 11 is an exploded view of the heat dissipation assembly according to one embodiment of the disclosure.
Figure 12:
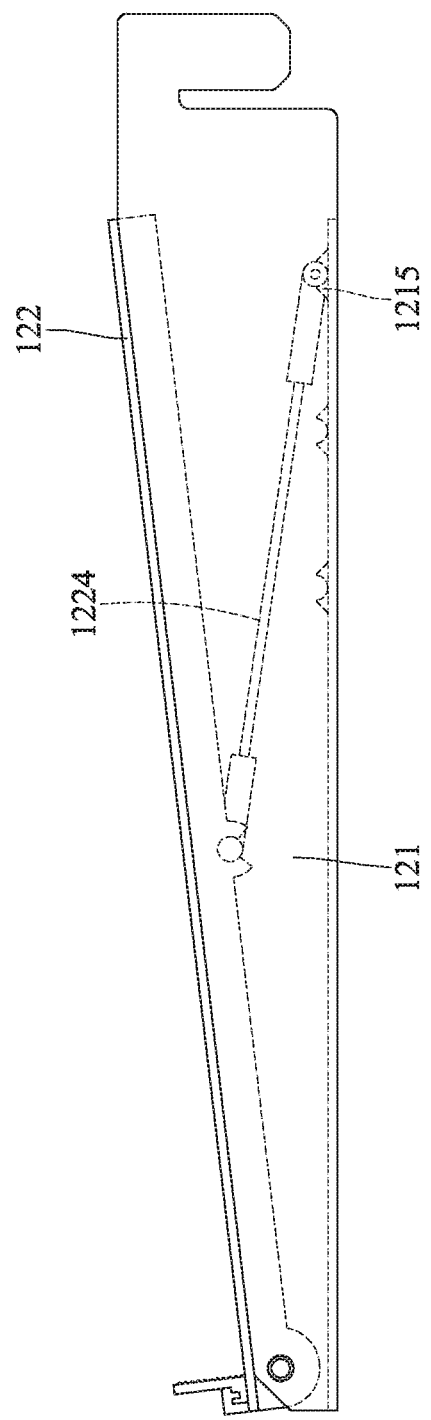
FIG. 12 is a side view of the heat dissipation assembly according to one embodiment of the disclosure.

Then, please refer to FIGS. 10-12, FIG. 10 is a perspective view of a heat dissipation assembly according to one embodiment of the disclosure, FIG. 11 is an exploded view of the heat dissipation assembly according to one embodiment of the disclosure, and FIG. 12 is a side view of the heat dissipation assembly according to one embodiment of the disclosure. As shown in figures, the heat dissipation assembly 12 includes the base body 121 and the supporting plate 122, the base body 121 has two opposite sidewalls (a first sidewall 1211 and a second sidewall 1212) and a bottom plate 1213 connected to the first sidewall 1211 and the second sidewall 1212. The first sidewall 1211 and the second sidewall 1212 are substantially perpendicular to the bottom plate 1213. In one embodiment, the first sidewall 1211, the second sidewall 1212 and the bottom plate 1213 are made of the same piece of metal, thus it is understood that the base body 121 is a single piece. At least one of the first sidewall 1211 and the second sidewall 1212 has the protrusion part 123. In this embodiment, both of the first sidewall 1211 and the second sidewall 1212 have the protrusion part 123. The description of the protrusion part 123 is described above, so it will not be repeated hereafter.

In addition, at least one of the first sidewall 1211 and the second sidewall 1212 has a connecting part 1214. In this embodiment, both of the first sidewall 1211 and the second sidewall 1212 have the connecting part 1214. The supporting plate 122 has at least one connecting part 1223 corresponding to the connecting part 1214. The connecting parts 1214 on the first sidewall 1211 and the second sidewall 1212 can be aligned with and pivoted to the connecting parts 1223 on the supporting plate 122. However, the present disclosure is not limited to the configurations of the connecting part 1214 and the connecting part 1223, any designs, that can be detachably connected to each other, all can be considered as the connecting part 1214 and the connecting part 1223 of the present disclosure.

In practice, a distance between the first sidewall 1211 and the second sidewall 1212 would be slightly smaller than a width of the supporting plate 122, such that the supporting plate 122 can be placed on the first sidewall 1211 and the second sidewall 1212. For example, the supporting plate 122 may be supported by at least one of the first sidewall 1211 and the second sidewall 1212. In more detail, the first sidewall 1211 has an inclined edge 12111, the second sidewall 1212 has an inclined edge 12121, and the supporting plate 122 may be supported by the inclined edge 12111 and the inclined edge 12121. As shown in the figure, the first sidewall 1211 and the second sidewall 1212 are in a trapezoid shape, and the supporting plate 122 is supported by the inclined edges (i.e. the inclined edges 12111 and 12121) of the first sidewall 1211 and the second sidewall 1212. When the supporting plate 122 is being placed on the inclined edges of the first sidewall 1211 and the second sidewall 1212, the supporting plate 122 is inclined and has an angle with respect to the bottom plate 1213.

The supporting plate 122 has an air permeable area 1221 connected two opposite sides of the supporting plate 122. In one embodiment, the air permeable area 1221 includes a plurality of air pores (not numbered) that penetrate through the supporting plate 122 so as to allow air to flow through the two opposite sides of the supporting plate 122. However, the quantity and shape of the air pores in the air permeable area 1221 are not restricted, as long as they can achieve air flowing through the two opposite sides of the supporting plate 122. In one example, the notebook computer can be placed on the air permeable area 1221 of the supporting plate 122, such that the notebook computer is able to suck air through the air permeable area 1221, thereby avoiding the problem that the notebook computer has a difficulty to suck air when it is directly disposed on desk.

In addition, to prevent the notebook computer from sliding down when it is placed on the inclined supporting plate 122, there may be a non-slip structure on the supporting plate 122. For example, there may be a non-slip pad on a top surface of the supporting plate 122. In another example, the top surface of the supporting plate 122 is a rough surface which is non-slip. In one embodiment, the supporting plate 122 has at least one stopper 1222, which protrudes from and is movably disposed on the top surface of the supporting plate 122. The stopper 1222 is able to support the notebook computer so as to prevent it from sliding down. The size and quantity of the stopper 1222 are not restricted, they can be adjusted according to actual requirements. Furthermore, since the stoppers 1222 are movable, so they can support different size notebook computers. On the other hand, if the stoppers 1222 are immovable, a small notebook computer might slide down via the space between the stoppers 1222, and the stoppers 1222 might not stably support the notebook computer when the notebook computer is not placed symmetrically on stoppers 1222.

In one embodiment, one or more stoppers 1222 can be freely slide with respect to the supporting plate 122 via a rail (not shown). When the notebook computer is put closer to, for example, the left side of the supporting plate 122, the stoppers 1222 can be moved leftward to properly support the notebook computer. In another embodiment, the supporting plate 122 may have plural insertion holes for the stoppers 1222, such that the stoppers 1222 can be switched places according to the position of the notebook computer. For example, when the notebook computer is put closer to the left side of the supporting plate 122, the stoppers 1222 can be unplugged and then inserted to the insertion holes closer to the left so as to properly support the notebook computer.

In one embodiment, a supporting rod 1224 is pivoted at a bottom surface of the supporting plate 122 facing the bottom plate 1213 of the base body 121. The position of the supporting plate 122 can be adjusted by pivoting the supporting rod 1224. By pivoting the supporting rod 1224, the supporting plate 122 can be pivoted about the connecting part 1214 and the connecting part 1223 so as to adjust an angle between the supporting plate 122 and the bottom plate 1213. The bottom plate 1213 of the base body 121 have plural retainers 1215 for retaining the supporting rod 1224. The supporting rod 1224 is, for example, a U-shaped rod, such that it can stably in contact with the bottom plate 1213 and provide a non-slip effect and better support.

Figure 13:
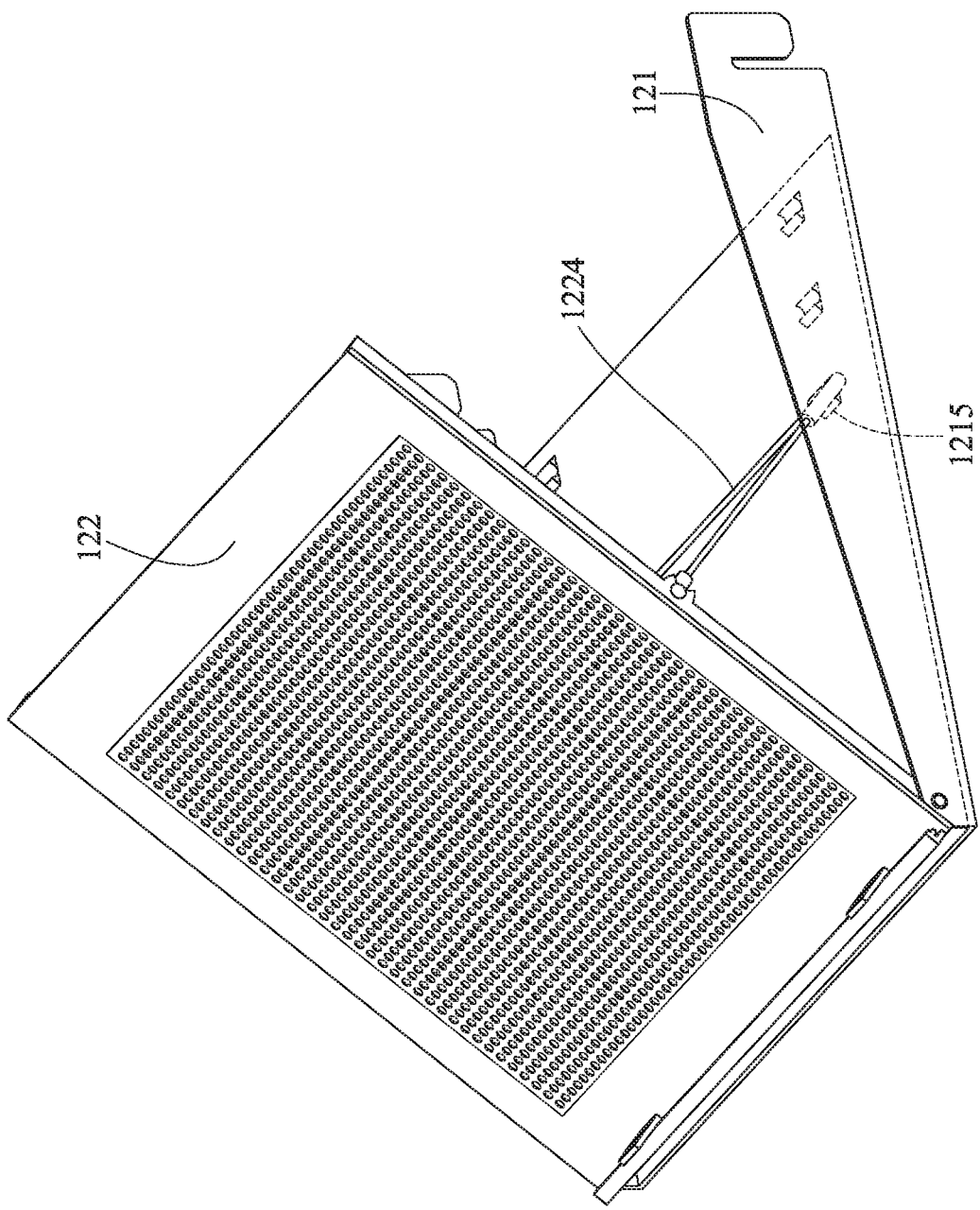
FIG. 13 is another perspective view of the heat dissipation assembly according to one embodiment of the disclosure.
Figure 14:
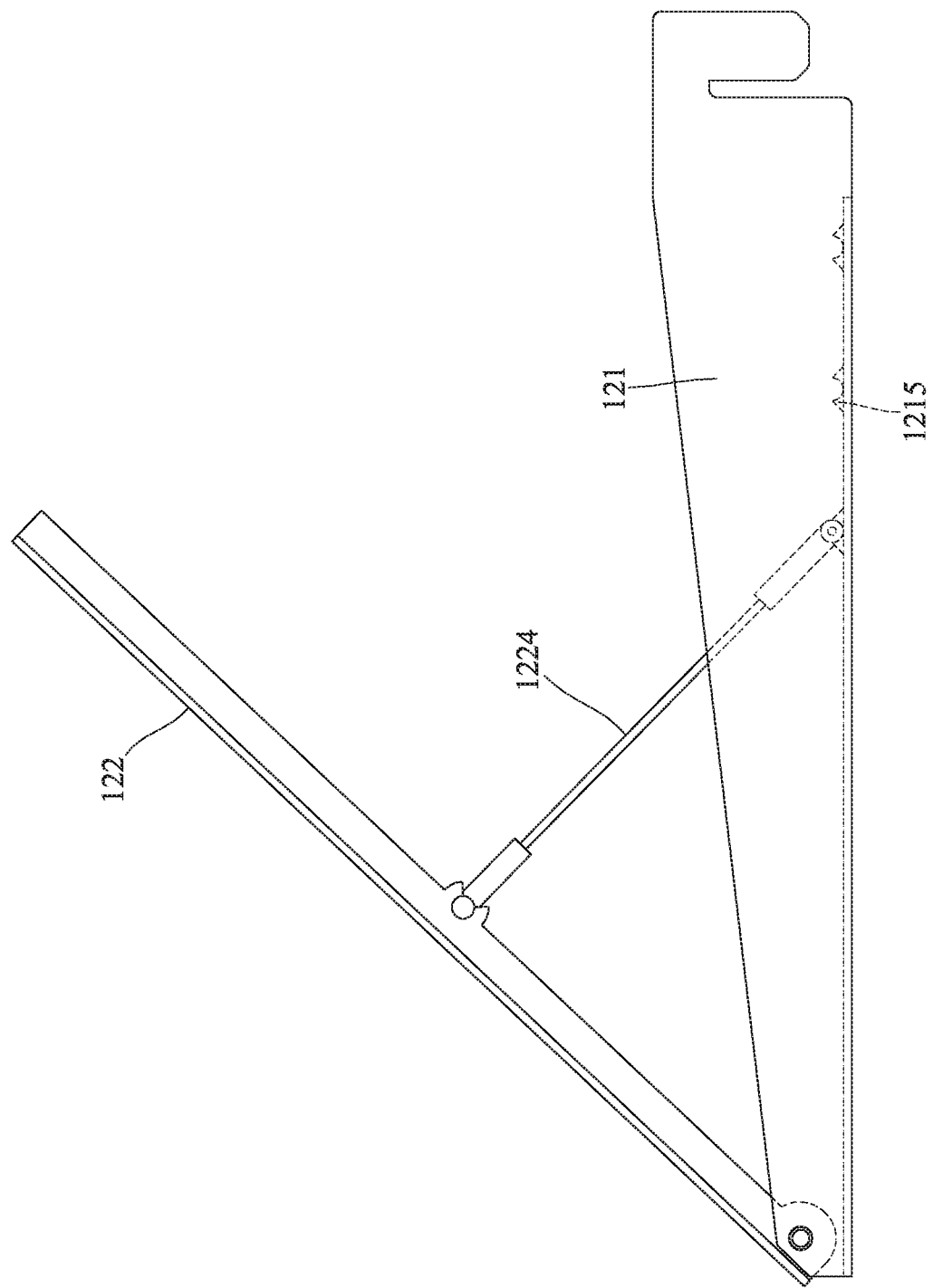
FIG. 14 is another side view of the heat dissipation assembly according to one embodiment of the disclosure.

Please refer to FIGS. 13-14, FIG. 13 is another perspective view of the heat dissipation assembly according to one embodiment of the disclosure, and FIG. 14 is another side view of the heat dissipation assembly according to one embodiment of the disclosure. As shown in the figures, the connecting part 1214 is pivoted to the connecting part 1223, so the supporting plate 122 can be pivoted with respect to the base body 121 when the supporting rod 1224 is retained by at least one of the retainers 1215 so that the supporting plate 122 can be movable among different positions.

For example, when the supporting plate 122 has a first angle with the bottom plate 1213 of the base body 121, the supporting plate 122 is in a first position; when the supporting plate 122 has a second angle with the bottom plate 1213 of the base body 121, and the first angle is different from the second angle, the supporting plate 122 is in a second position which is different from the first position. It is understood that the angle between the supporting plate 122 and the bottom plate 1213 can be changed when the supporting rod 1224 is switched among the retainers 1215, such that the supporting plate 122 is able to be switched to different positions (e.g., the first position, the second position and other positions). That is, when the supporting rod 1224 is retained by one of the retainers 1215, the supporting plate is in, for example, the first position; when the supporting rod 1224 is retained by another retainer 1215, the supporting plate 122 is in, for example, the second position.

In practice, in order to stably support the notebook computer on the supporting plate 122, the angle between the supporting plate 122 and the bottom plate 1213 is better not greater than 60 degrees. In one embodiment, the angle between the supporting plate 122 and the bottom plate 1213 can approximately be 5 degrees, 15 degrees, 30 degrees, or 45 degrees.

Figure 15:
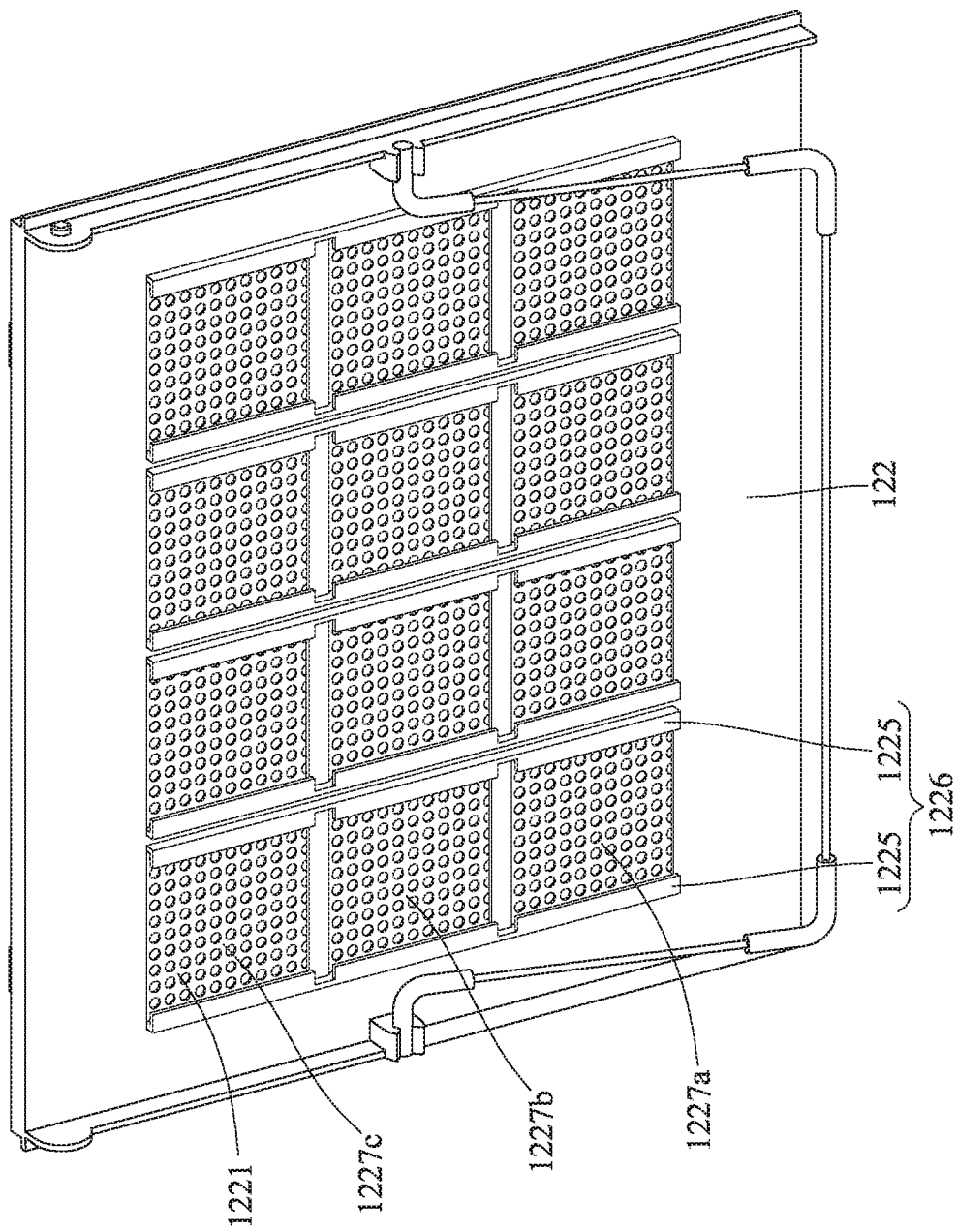
FIG. 15 is a perspective view of a supporting plate according to one embodiment of the disclosure.
Figure 16:
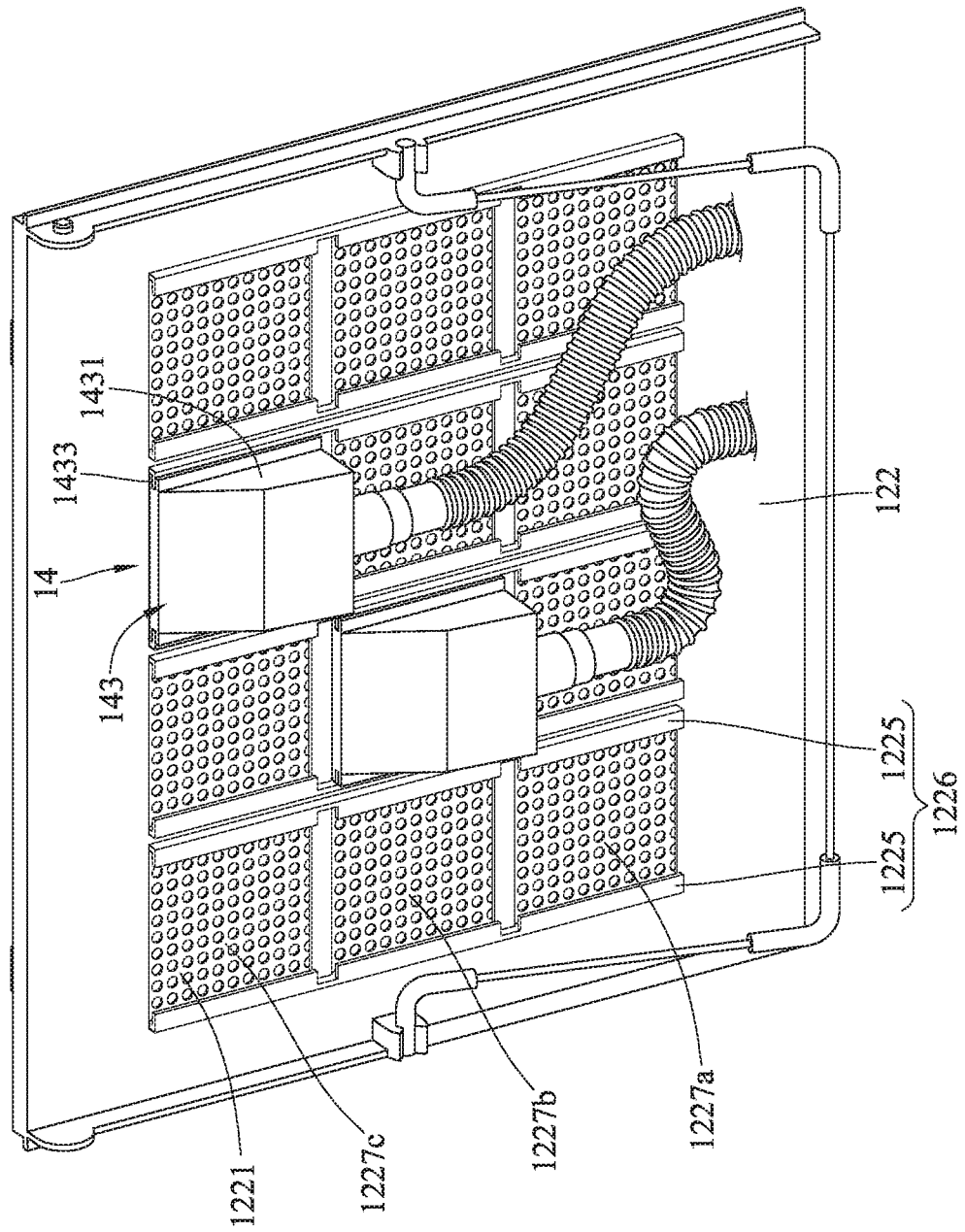
FIG. 16 is a perspective view of the supporting plate and the air pipe assembly according to one embodiment of the disclosure.

Then, please refer to FIGS. 15-16, FIG. 15 is a perspective view of a supporting plate according to one embodiment of the disclosure, and FIG. 16 is a perspective view of the supporting plate and the air pipe assembly according to one embodiment of the disclosure. As shown in the figures, the second end portion 143 of the air pipe assembly 14 has the cover 1431 having the contact surface 1432 in which plural positioning parts 1433 are disposed on the periphery thereof, and the positioning parts 1433 are used to connect the second end portion 143 to the supporting plate 122. In one embodiment, each positioning part 1433 can be slidably disposed in the groove 1225 formed on a bottom surface of the supporting plate 122, and the cover 1431 has a width the same as a distance between each pair of grooves 1225. Thus, the cover 1431 can be slidably placed between two of the grooves 1225 via the positioning parts 1433 without falling off. A pair of grooves 1225 form a rail 1226 for the cover 1431.

In the case of FIG. 15, there are eight rows of grooves 1225 on the bottom surface of the supporting plate 122, each pair of grooves 1225 form the rail 1226, so there are four pairs of grooves 1225. In this case, an area between these four rails 1226 is substantially the same as an area of the air permeable area 1221, thus the moving range of the cover 1431 falls within the air permeable area 1221. One rail 1226 corresponds to three sub-areas 1227a, 1227b, and 1227c of the air permeable area 1221, and there is an auxiliary positioning structure between the sub-areas 1227a, 1227b, and 1227c. When the cover 1431 is slide on the rail 1226, the auxiliary positioning structure can help the cover 1431 to stop at the sub-area 1227a, the sub-area 1227b or the sub-area 1227c. When the heat dissipation device 1 is activated, the refrigerator 10 starts to provide cool air from the cool air opening 103, and then the cool air is transferred to the cover 1431 through the air pipe assembly 14. Since the cover 1431 can be freely moved on the air permeable area 1221, such that, when the notebook computer is placed on the supporting plate 122, the cover 1431 can be moved to align with an air inlet of the notebook computer, helping the notebook computer to suck the cool air so as to improve cooling efficiency of the notebook computer.

However, the cover 1431 is not restricted to align with the sub-area 1227a, the sub-area 1227b or the sub-area 1227c, the cover 1431 still can provide the cool air to the notebook computer even when it is located between two of the sub-areas. In addition, the air permeable area 1221 is divided into twelve sub-areas which are arranged into a 4*3 array, and the sub-areas are substantially the same in area, such that four rails 1226 can each correspond to three sub-areas. The quantity of the groove and the quantity of the sub-areas in the air permeable area can be adjusted according to actual requirements. For example, in some other embodiments, the air permeable area can be divided into a 4*2 or 5*3 array. In one embodiment, an area defined by an outer edge of the contact surface 1432 of the cover 1431 is substantially the same as an area of the sub-area, but the present disclosure is not limited thereto. In some other embodiments, the area surrounded by the outer edge of the contact surface of the cover may be two times the area of the sub-area.

In addition, FIG. 16 shows two air pipe assemblies 14 being mounted on the rails 1226, but the air pipe assemblies 14 is removable from the rails 1226, for example, by sliding the cover 1431 to an end of the rail 1226. In one embodiment, the hollow tube 141 of the air pipe assembly 14 has a certain length and a certain degree of flexibility, allowing the cover 1431 to be mounted to different rails 1226. In one embodiment, there are a sufficient number of air pipe assembly 14 so that all the rail 1226 are each mounted with one air pipe assembly 14, but some of the air pipe assemblies 14, which are not in use, can be closed by closing the respective valve 1031 at the cool air opening 103.

As shown in FIG. 16, the cover 1431 of the air pipe assembly 14 is restricted to move in a single direction (e.g. a vertical direction) along the rail 1226, but the present disclosure is not limited thereto. In some other embodiments, the cover 1431 may be moved in a horizontal direction if the supporting plate 122 is properly modified.

Figure 17:
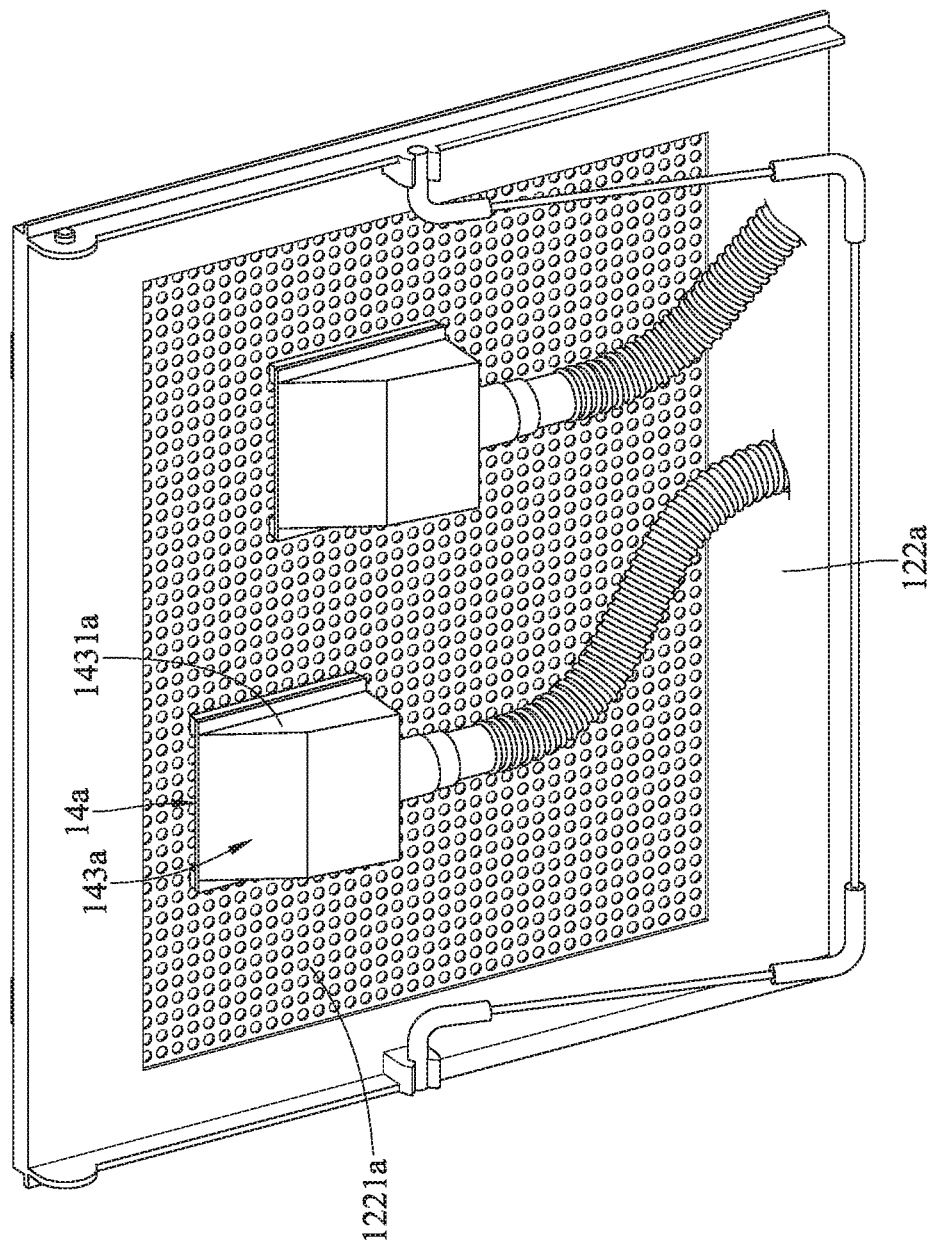
FIG. 17 is a perspective view of a supporting plate and an air pipe assembly according to another embodiment of the disclosure.

However, the aforementioned grooves 1226 are optional. For example, please refer to FIG. 17, FIG. 17 is a perspective view of a supporting plate and an air pipe assembly according to another embodiment of the disclosure. As shown in FIG. 17, the supporting plate 122a may contain ferromagnetic materials, and the positioning parts 1433a are magnetic components, such that the cover 1431a can be attached on the bottom surface of the supporting plate 122a via magnetic force between the positioning parts 1433a and the supporting plate 122a. In one embodiment, the supporting plate 122a may partially contain ferromagnetic materials, for example, within the range of the air permeable area 1221a, such that the cover 1431a is freely movable in the air permeable area 1221a. In such a case, the rest portion of the supporting plate 122a may be made of plastic, thus the supporting plate 122a is a mixed material plate.

Accordingly, when the notebook computer is put on the supporting plate 122a, the cover 1431a can be attached on the bottom surface of the supporting plate 122a and moved to align with the air inlet of the notebook computer so as to provide the cool air directly into the air inlet of the notebook computer, thereby improving the cooling efficiency of the notebook computer. There might be a plurality of air pipe assemblies 14a mounted on the supporting plate 122a, so one or more of the air pipe assemblies 14, which are not in use, can be closed by closing the respective valve 1031 at the cool air opening 103.

Figure 18:
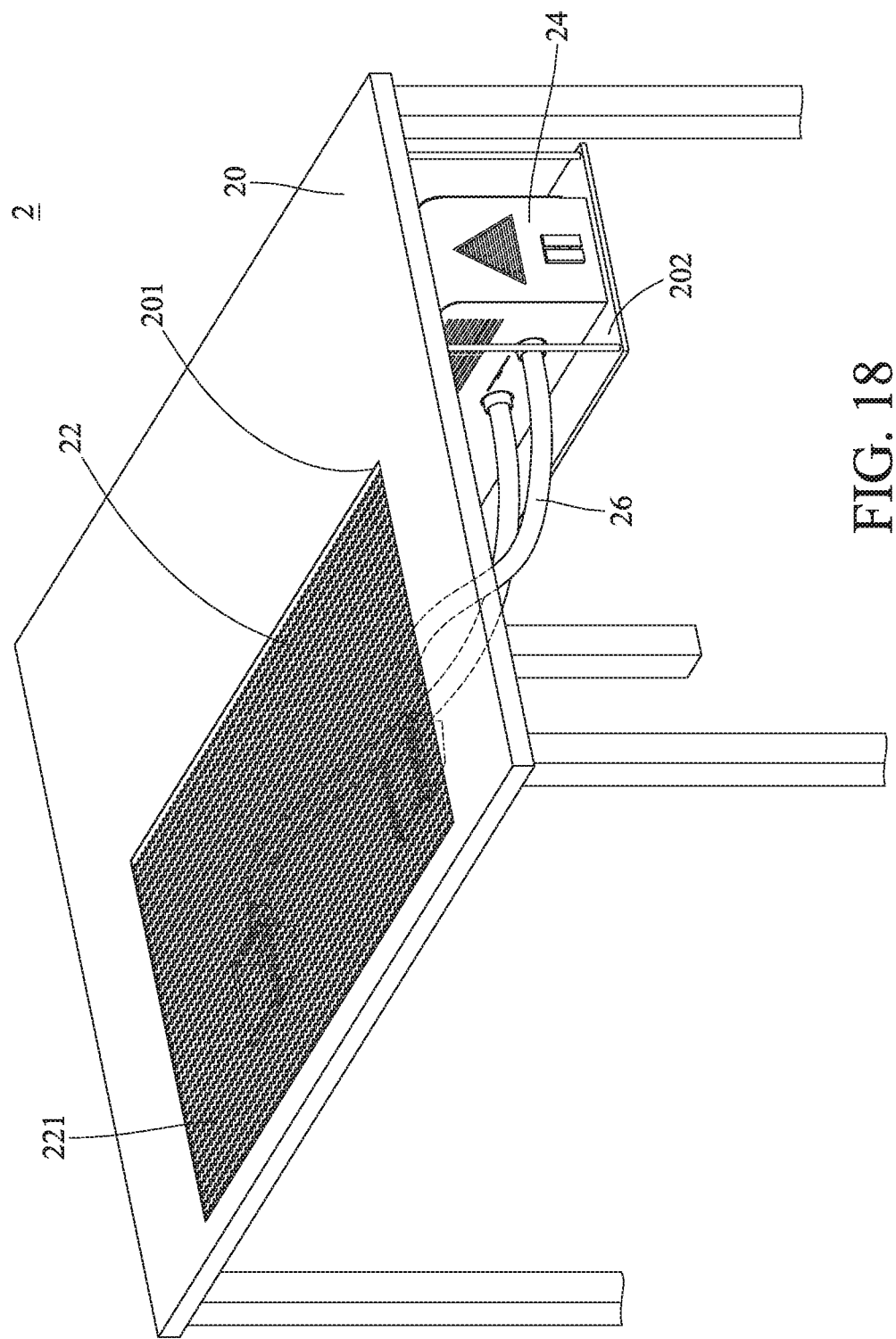
FIG. 18 is a perspective view of a table having a heat dissipation device according to one embodiment of the disclosure.

In addition, the sizes of the refrigerator 10, the heat dissipation assembly 12 and the air pipe assembly 14 are not restricted and can be adjusted according to the actual requirements. For example, the heat dissipation device 1 may have a variant for bigger electronic device. Please refer to FIG. 18, FIG. 18 is a perspective view of a table having a heat dissipation device according to one embodiment of the disclosure. As shown in FIG. 18, there is a table 2 including a table board 20, a supporting plate 22, a refrigerator 24 and an air pipe assembly 26. The refrigerator 24 and the air pipe assembly 26 is similar to the refrigerator 10 and the air pipe assembly 14 in previous embodiment. The difference between the two embodiments is that the table 2 does not include the base body 121, and the supporting plate 22 is directly assembled with the table board 20. In one embodiment, the table 2 seems like a normal table, dining table or computer desk, it can have one or more legs so that the table board 20 has a certain height, but the present disclosure is not limited by the quantity, the shape or the type of the legs.

The table board 20 has a recess 201 on its top surface, and the supporting plate 22 disposed in the recess 201. The recess 201 may or may not penetrate through the table board 20, the present disclosure is not limited thereto. In one embodiment, the top surface of the table board 20 and the top surface of the supporting plate 22 are substantially coplanar; that is, the top surface of the table 2 is substantially flat, such that the table 2 can be taken as a normal table having no step. The supporting plate 22 has an air permeable area 221. In one embodiment, the supporting plate 22 has a plurality of air pores in the air permeable area 221, and the air permeable area 221 is approximately as large as the supporting plate 22.

In one embodiment, the table 2 further includes a shelf 202 for the refrigerator 24. FIG. 18 shows that the shelf 202 is disposed at the bottom surface of the table board 20, but the present disclosure is not limited thereto. In some other embodiments, the shelf 202 may be disposed on the top surface of the table board 20. In another embodiment, the shelf can be replaced with a drawer, cabinet or any other suitable for storing the refrigerator 24.

Figure 19:
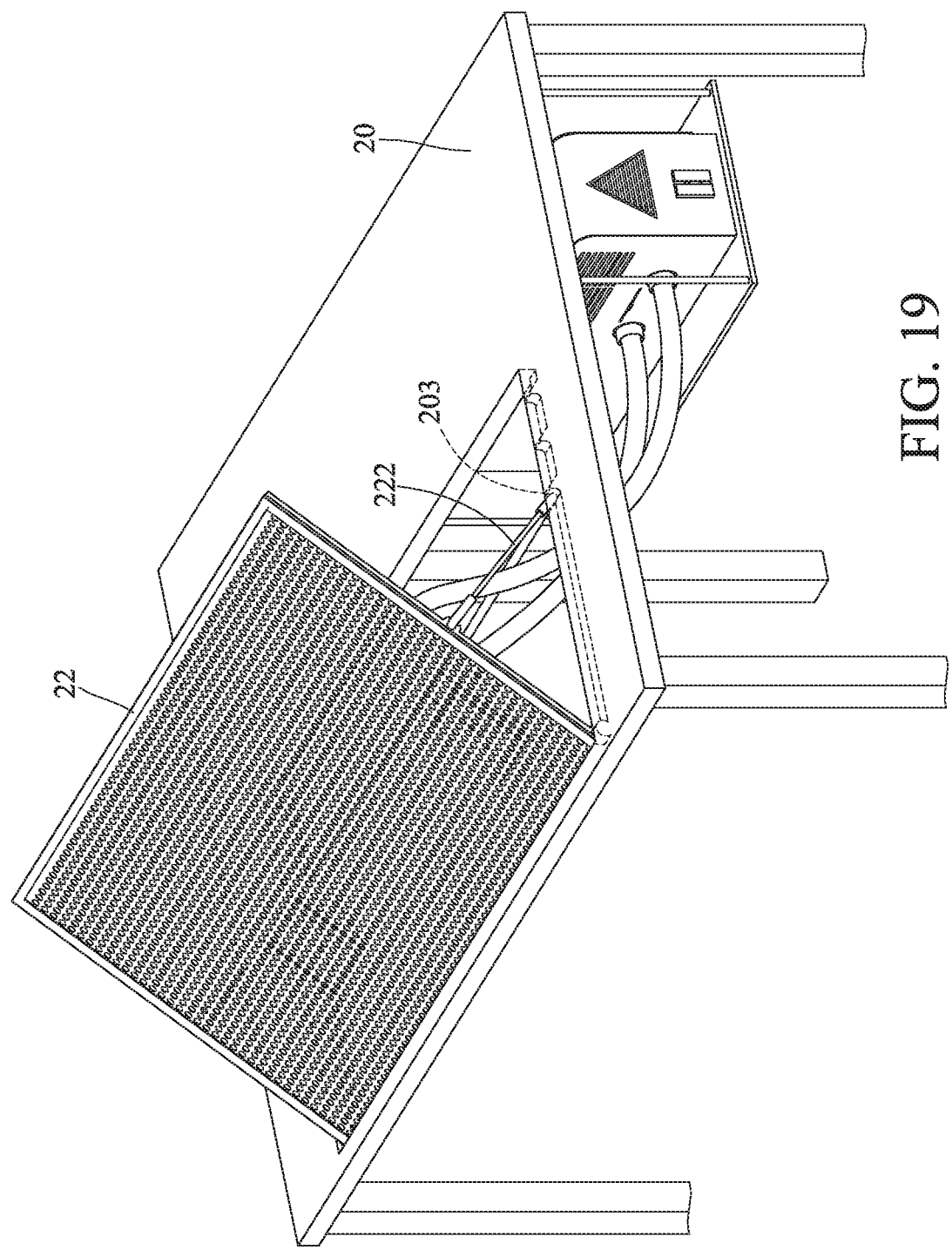
FIG. 19 is another perspective view of a table having the heat dissipation device according to one embodiment of the disclosure.

Furthermore, the table 2 has no base body but it is still able to adjust the angle of the supporting plate. Please refer to FIG. 19, FIG. 19 is another perspective view of a table having the heat dissipation device according to one embodiment of the disclosure. As shown in FIG. 19, there are a plurality of retainers 203 in the recess 201, and there is a supporting rod 222 which is pivoted to the supporting plate 22 and can be retained by at least one of the retainers 203. When the supporting rod 222 is switched among the retainers 203, the angle between the supporting plate 22 and the table board 20 would change, such that the supporting plate 22 is able to be switched to different positions. In practice, in order to stably support the notebook computer on the supporting plate 22, the angle between the supporting plate 22 and the table board 20 is better not greater than 60 degrees. In one embodiment, the angle between the supporting plate 22 and the table board 20 can approximately be 5 degrees, 15 degrees, 30 degrees, or 45 degrees. In addition, the present disclosure is not limited to the configuration of the supporting rod 222. In the case that the recess 201 does not penetrate through the table board 20, the supporting rod 222 may be a U-shaped rod, such that the supporting rod 222 is not only be supported by the retainers 203 but also in contact with the recess 201, thereby providing a non-slip effect and better support. In the case that the recess 201 penetrates through the table board 20, two opposite sides of the supporting plate 22 both are provided with the supporting rod 222, such that the supporting rod 222 is only supported by the retainer 203.

Please keep referring to FIGS. 18-19, the cool air generated by the refrigerator 24 is transferred to the bottom surface of the air permeable area 221 of the supporting plate 22 via the air pipe assembly 26, and the air permeable area 221 is connected through two sides of the supporting plate 22, so the cool air generated by the refrigerator 24 can be directly guided to the air permeable area 221 via the air pipe assembly 26, and the cover of the air pipe assembly 26 can be placed at a desired location. In addition, as long as the air pipe assembly 26 is sufficient in length, the cool air still can be directly guided to the air permeable area 221 via the flexible air pipe assembly 26 when the angle between the supporting plate 22 and the table board 20 changes. The other advantages of the table 2 are as described in the embodiment of heat dissipation device 1, which will not be repeated herein.

According to the heat dissipation device, the heat dissipation assembly, the air pipe assembly and the table as discussed in above, the electronic device can be placed on a portion of the supporting plate which is permeable to air, so the electronic device is able to suck cool air from bottom side. In addition, the air pipe assembly helps to targetedly provide cool air generated by the refrigerator to the electronic device, thereby reducing the chance of the cool air to from escaping to the environment. That is, the position of the air pipe assembly can be changed according to the location of the air inlet of the electronic device, which allows the electronic device to directly suck the cool air, thereby improving the cooling efficiency of the electronic device as well as solving the heat dissipation problem in the prior art.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A heat dissipation device for electronic device, comprising:
    a refrigerator, having a cool air opening;
    an air pipe assembly, having a first end portion and a second end portion, and the first end portion detachably connected to the cool air opening; and
    a heat dissipation assembly, having a base body and a supporting plate, the base body detachably connected to the refrigerator, the supporting plate pivoted to the base body so as to be movable between a first position and a second position, wherein when the supporting plate is in the first position, the supporting plate has a first angle with a bottom plate of the base body; when the supporting plate is in the second position, the supporting plate has a second angle with the bottom plate;
    wherein the second end portion is detachably connected to the supporting plate, the supporting plate has an air permeable area, and the second end portion is movably disposed in the air permeable area;
    wherein the air permeable area is divided into a plurality of sub-areas, and the second end portion of the air pipe assembly is movable among the plurality of sub-areas.

2. The heat dissipation device according to claim 1, wherein the base body has a protrusion part, the refrigerator has a slot, and the protrusion part is detachably disposed in the slot, such that the base body is detachably connected to the refrigerator.

3. The heat dissipation device according to claim 1, wherein the base body has a first fastener, the refrigerator has a second fastener, and the first fastener is detachably connected to the second fastener, such that the base body is detachably connected to the refrigerator.

4. The heat dissipation device according to claim 1, wherein the base body has a first appearance shape, the refrigerator has a second appearance shape, and the first appearance shape is detachably assembled to the second appearance shape, such that the base body is detachably connected to the refrigerator.

5. The heat dissipation device according to claim 1, wherein the supporting plate is connected with a supporting rod, the base body has a plurality of retainers, when the supporting rod is retained by one of the plurality of retainers, the supporting plate is in the first position, when the supporting rod is retained by another one of the plurality retainers, the supporting plate is in the second position.

6. The heat dissipation device according to claim 1, wherein the air permeable area is connected to two opposite sides of the supporting plate.

7. The heat dissipation device according to claim 1, wherein the supporting plate has a top surface and a bottom surface, and the second end portion in the air permeable area is in contact with the bottom surface.

8. The heat dissipation device according to claim 7, wherein the supporting plate has at least one stopper which is movably disposed on the top surface of the supporting plate.

9. The heat dissipation device according to claim 7, wherein the air pipe assembly further has a hollow tube, the first end portion is connected to an end of the hollow tube, and the second end portion is connected to another end of the hollow tube.

10. The heat dissipation device according to claim 9, wherein the second end portion further has a cover, the cover has a cavity therein, the cavity is connected to a chamber of the hollow tube, the cover has a contact surface, and a peripheral of the contact surface is disposed with a plurality positioning parts.

11. The heat dissipation device according to claim 10, wherein the supporting plate has a plurality of grooves in the air permeable area, and the plurality of positioning parts are movably disposed in the plurality of grooves.

12. The heat dissipation device according to claim 11, wherein the air permeable area is divided into the plurality of sub-areas by the plurality of grooves, and the plurality of sub-areas are substantially the same in area.

13. The heat dissipation device according to claim 11, wherein the air permeable area is divided into the plurality of sub-areas by the plurality of grooves, and an area defined by an outer edge of the contact surface is substantially the same as an area of each of the plurality of sub-areas.

14. The heat dissipation device according to claim 10, wherein each of the plurality of positioning parts is a magnetic component, in the air permeable area, at least a portion of the supporting plate contains ferromagnetic materials.

15. The heat dissipation device according to claim 10, wherein the hollow tube is flexible.

16. The heat dissipation device according to claim 1, wherein the refrigerator includes:
    a compressor, configured to compress a refrigerant;
    a first heat exchanger, configured to receive the refrigerant which is processed by the compressor;
    a pressure relief valve, configured to receive the refrigerant which is processed by the first heat exchanger;

a second heat exchanger, configured to receive the refrigerant which is processed by the pressure relief valve; and a plurality of refrigerant pipes, connected through the compressor, the first heat exchanger, the pressure relief valve and the second heat exchanger so as to form a sealed channel for accommodating the refrigerant;

wherein the cool air opening is located close to the second heat exchanger and is configured to output air in a periphery of the second heat exchanger.

17. The heat dissipation device according to claim 16, wherein the refrigerator further comprises a casing and a water tank, the compressor, the first heat exchanger, the pressure relief valve, the second heat exchanger, and the plurality of refrigerant pipes are disposed within the casing, the water tank is detachably connected to the casing, and the water tank is configured to accommodate liquid generated by the refrigerator.

* * * * *